US010246634B2

(12) United States Patent
Yang et al.

(10) Patent No.: US 10,246,634 B2
(45) Date of Patent: Apr. 2, 2019

(54) QUANTUM DOT HAVING POLYMERIC OUTER LAYER, PHOTOSENSITIVE COMPOSITIONS INCLUDING THE SAME, AND QUANTUM DOT POLYMER COMPOSITE PATTERN PRODUCED THEREFROM

(71) Applicant: SAMSUNG ELECTRONICS CO., LTD., Suwon-si, Gyeonggi-do (KR)

(72) Inventors: Hyeyeon Yang, Yongin-si (KR); Shang Hyeun Park, Yongin-si (KR); Shin Ae Jun, Seongnam-si (KR); Eun Joo Jang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 90 days.

(21) Appl. No.: 15/333,417

(22) Filed: Oct. 25, 2016

(65) Prior Publication Data
US 2017/0158954 A1 Jun. 8, 2017

(30) Foreign Application Priority Data
Oct. 26, 2015 (KR) .......................... 10-2015-0148948

(51) Int. Cl.
*G03F 7/00* (2006.01)
*B82Y 99/00* (2011.01)
(Continued)

(52) U.S. Cl.
CPC ............ *C09K 11/025* (2013.01); *C09K 11/70* (2013.01); *G03F 7/0007* (2013.01);
(Continued)

(58) Field of Classification Search
CPC ...... G03F 7/0007; G03F 7/0047; G03F 7/322; G03F 7/033; G03F 7/028; G03F 7/162
See application file for complete search history.

(56) References Cited

U.S. PATENT DOCUMENTS 8,354,785 B2 *  1/2013  Clough ................. B82Y 30/00
313/498
8,642,991 B2     2/2014  Park et al.
(Continued)

FOREIGN PATENT DOCUMENTS

EP    2584623 A2    4/2013
EP    3147708 A1    3/2017
(Continued)

OTHER PUBLICATIONS

Extended European Search Report dated Jun. 6, 2017 issued for the corresponding European Patent Application No. 6195517.4.
(Continued)

*Primary Examiner* — Cynthia Hamilton
(74) *Attorney, Agent, or Firm* — Cantor Colburn LLP

(57) ABSTRACT

A photosensitive composition including a quantum dot complex having a polymeric outer layer, a carboxylic acid group-containing binder, a photopolymerizable monomer having a carbon-carbon double bond, a photoinitiator, and a solvent, wherein the polymeric outer layer includes a copolymer including:
a first repeating unit having a moiety capable of interacting with a surface of the quantum dot, an organic ligand compound bonded to the surface of the quantum dot, or a combination thereof, and
a second repeating unit having a reactive moiety.

25 Claims, 8 Drawing Sheets

(51) Int. Cl.
*C09K 11/02* (2006.01)
*C09K 11/70* (2006.01)
*G03F 7/004* (2006.01)
*G03F 7/033* (2006.01)
*G03F 7/105* (2006.01)

(52) U.S. Cl.
CPC ............ *G03F 7/0042* (2013.01); *G03F 7/033* (2013.01); *G03F 7/105* (2013.01); *B82Y 99/00* (2013.01)

(56) References Cited

U.S. PATENT DOCUMENTS

| | | | |
|---|---|---|---|
| 8,735,226 | B2 | 5/2014 | Chen et al. |
| 8,765,014 | B2 | 7/2014 | Cho et al. |
| 2004/0091710 | A1* | 5/2004 | Bawendi ................ B82Y 30/00 428/407 |
| 2004/0115817 | A1* | 6/2004 | Liu ...................... C09K 11/025 435/472 |
| 2007/0264501 | A1 | 11/2007 | Leatherdale et al. |
| 2009/0017268 | A1* | 1/2009 | Skipor ................... G03F 7/038 428/195.1 |
| 2009/0036625 | A1* | 2/2009 | Chang ................... C08F 222/04 526/272 |
| 2012/0267616 | A1 | 10/2012 | Jang et al. |
| 2013/0105854 | A1 | 5/2013 | Jang et al. |
| 2015/0203989 | A1 | 7/2015 | Xu et al. |
| 2017/0115561 | A1* | 4/2017 | Yang ..................... G03F 7/0007 |
| 2017/0115562 | A1* | 4/2017 | Kim ...................... G03F 7/0007 |

FOREIGN PATENT DOCUMENTS

| | | |
|---|---|---|
| KR | 10-2005-0055741 A | 6/2005 |
| KR | 10-2005-0112938 A | 12/2005 |
| KR | 10-2013-0132452 A | 12/2013 |

OTHER PUBLICATIONS

Ingrosso et al. "An Epoxy Photoresist Modified by Luminescent Nanocrystals for the Fabrication of 3D High-Aspect-Ratio Microstructures", Adv. Funct. Mater. 2007, 17, pp. 2009-2017.

Pedro J. Rodriguez-Canto et al. "UV-patternable nanocomposite containing CdSe and PbS quantum dots as miniaturized luminescent chemo-sensors", RSC Advances, 2015, 5, 19874-19883 (10 pp.).

\* cited by examiner

QUANTUM DOT HAVING POLYMERIC OUTER LAYER, PHOTOSENSITIVE COMPOSITIONS INCLUDING THE SAME, AND QUANTUM DOT POLYMER COMPOSITE PATTERN PRODUCED THEREFROM

CROSS-REFERENCE TO RELATED APPLICATION

This application claims priority to Korean Patent Application No. 10-2015-0148948 filed in the Korean Intellectual Property Office on Oct. 26, 2015, and all the benefits accruing therefrom under 35 U.S.C. § 119, the content of which are incorporated herein in its entirety by reference.

BACKGROUND

1. Field

A quantum dot complex having a polymeric outer layer, a photosensitive composition including the same, and a quantum dot-polymer composite pattern produced therefrom are disclosed.

2. Description of the Related Art

A liquid crystal display (hereinafter, LCD) is a display in which the polarized light passed through a liquid crystal layer passes through an absorptive color filter to express a color. LCD has drawbacks such as a narrow viewing angle and a low brightness due to a low ratio of light transmittance of the absorptive color filter. It is expected that replacing the absorptive color filter with a photoluminescent type color filter may increase the viewing angle and enhance the brightness of the display.

Quantum dots (QDs), which are dispersed in a polymer host matrix to have a form of a composite, are applicable in the various display devices. Quantum dots (hereinafter, also referred to as semiconductor nanocrystal) may be used as a light conversion layer in a light emitting diode (LED) or the like by dispersing in a host matrix of an inorganic material or a polymer. When a quantum dot is synthesized as a colloidal solution, the uniform particle size may be relatively easily controlled. When a quantum dot has a size of less than or equal to about 10 nanometers, the quantum confinement effects, in which the bandgap is increased with the decrease in a QD size, become significant, and thus the energy density is enhanced. The theoretical quantum efficiency (QY) of the quantum dot may be 100% and the quantum dot may emit light having high color purity (e.g., full width at half maximum (FWHM) of less than or equal to about 40 nanometers). This makes it possible to enhance a luminous efficiency and to improve a color gamut ratio. The quantum dot-polymer composite pattern may be applied to various devices, for example, the color filter for a liquid crystal display, in order to develop a high quality photoluminescent type LCD. Therefore, it is desirable to develop new techniques of patterning the quantum dot-polymer composite.

SUMMARY

An embodiment provides a photosensitive composition, which is a precursor of a pattern of a quantum dot-polymer composite.

Another embodiment provides a pattern of a quantum dot-polymer composite produced from the composition.

Yet another embodiment provides a quantum dot complex having a polymeric outer layer.

In an embodiment, a photosensitive composition includes:
a quantum dot complex having a polymeric outer layer;
a carboxylic acid group-containing binder;
a photopolymerizable monomer having a carbon-carbon double bond;
a photoinitiator; and
a solvent,
wherein the polymeric outer layer includes a copolymer, which includes:
a first repeating unit having a moiety capable of interacting with a surface of the quantum dot, an organic ligand compound bonded to the surface of the quantum dot, or a combination thereof; and
a second repeating unit having a reactive moiety.

The polymeric outer layer of the quantum dot may further include an intermolecular or intramolecular crosslinking moiety that links the reactive moieties of the copolymer.

The crosslinking moiety may be represented by Chemical Formula 1 or Chemical Formula 2:

$$L+A-*)_n \quad \text{Chemical Formula 1}$$

wherein, each A is the same or different and is independently an amide group, an ester group, a thioester group, an ether group, a thioether group, a C1 to C20 alkylene group, a C3 to C20 alkenylene group, or a combination thereof, L is a C1 to C20 aliphatic hydrocarbon group, a C3 to C40 alicyclic hydrocarbon group, or C6 to C40 aromatic hydrocarbon group,

* is a linking portion to the reactive moiety of the copolymer, and n is an integer ranging from 2 to 7, wherein n is less than or equal to valence of L, $$*-A+L-N+_m L-A-* \quad \text{Chemical Formula 2}$$
$$\underset{*}{\overset{|}{\underset{CO}{|}}}$$

wherein, each A is the same or different and is independently an amide group, an ester group, a thioester group, an ether group, a thioether group, a C1 to C20 alkylene group, a C3 to C20 alkenylene group, or a combination thereof, each L is the same or different and is independently a C1 to C20 aliphatic hydrocarbon group or a C6 to C40 aromatic hydrocarbon group,

* is a linking portion to the reactive moiety of the copolymer, and m is an integer ranging from 1 to 10.

The first repeating unit may have a moiety in a backbone or as a pendant group of the copolymer, which is capable of interacting with the surface of the quantum dot, the organic ligand compound bonded to the surface of the quantum dot, or a combination thereof.

The first repeating unit may be represented by Chemical Formula 3:

Chemical Formula 3

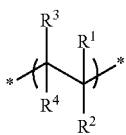

wherein, $R^1$, $R^2$, $R^3$, and $R^4$ are independently hydrogen, a C1 to C20 alkyl group, a C1 to C20 alkyl group substituted with a functional group capable of bonding to the surface of the quantum dot, a C6 to C40 aryl group, a C6 to C40 aryl group substituted with a functional group capable of bonding to the surface of the quantum dot, a C7 to C40 arylalkyl group, a C7 to C40 arylalkyl group substituted with a functional group capable of bonding to the surface of the quantum dot, a C1 to C30 fluoroalkyl group, a C1 to C30 fluoroalkyl group substituted with a functional group capable of bonding to the surface of the quantum dot, a C1 to C30 perfluoroalkyl group, or a C1 to C30 perfluoroalkyl group substituted with a functional group capable of bonding to the surface of the quantum dot, provided that $R^1$, $R^2$, $R^3$ and $R^4$ are not simultaneously hydrogen.

The functional group capable of bonding to the surface of the quantum dot may include COOH, $NH_2$, NH, N, SH, PO, P, OH, COOR', $PO(OH)_2$, or POOH.

The reactive moiety of the second repeating unit may be present in a backbone or as a pendant group of the copolymer.

The reactive moiety may be a C2 to C20 alkenyl group, a C2 to C20 alkynyl group, an epoxy group, an anhydride group, an imide group, a C2 to C20 alkyl carboxylic acid group, a C2 to C20 alkyl ester group, a thiol group, or a combination thereof.

The second repeating unit may be represented by any of Chemical Formula 4 to Chemical Formula 12:

Chemical Formula 4

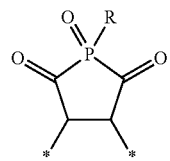

Chemical Formula 5

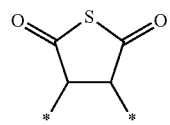

Chemical Formula 6

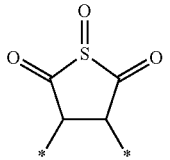

Chemical Formula 7

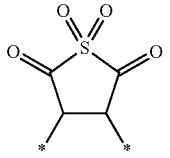

Chemical Formula 8

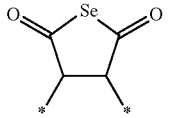

Chemical Formula 9

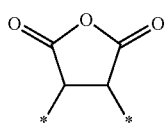

Chemical Formula 10

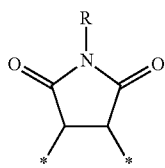

Chemical Formula 11

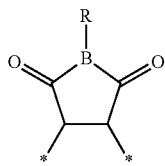

Chemical Formula 12

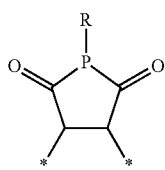

wherein, in the chemical formulae, R is H, a C1 to C10 alkyl group, or a C6 to C20 aryl group, and wherein \* is a portion that links to an adjacent atom present in a backbone of the copolymer.

The copolymer may be a random copolymer.

The copolymer may include a styrene-maleic anhydride copolymer, a styrene-maleimide copolymer, or a combination thereof.

The organic ligand compound may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 aliphatic hydrocarbon group or a C5 to C20 aromatic hydrocarbon group), a polymer organic ligand, or a combination thereof.

The quantum dot may include a Group II-VI compound, a Group III-V compound, a Group IV-VI compound, a Group IV compound, a Group I-III-VI compound, a Group I-II-IV-VI compound, or a combination thereof.

The carboxylic acid group-containing binder may have an acid value of greater than or equal to about 50 milligrams of KOH per gram.

The photosensitive composition may be developable by an alkali aqueous solution after exposure.

The photosensitive composition may include:

about 1 percent by weight to about 40 percent by weight of the quantum dot complex having a polymeric outer layer;

about 0.5 percent by weight to about 35 percent by weight of the carboxylic acid group-containing binder;

about 0.5 percent by weight to about 20 percent by weight of the photopolymerizable monomer; and about 0.01 percent by weight to about 10 percent by weight of the photoinitiator; and a balance amount of the solvent based on the total weight of the composition.

In another embodiment, provided is a quantum dot-polymer composite pattern, which is a product of a method including:

coating the composition on a substrate to form a film;

selectively exposing the film to light; and developing the selectively exposed film with an alkali aqueous solution.

Another embodiment provides an electronic device including the aforementioned quantum dot-polymer composite pattern.

In another embodiment, the quantum dot complex includes:

an organic ligand compound bonded to the surface of the quantum dot, and a polymeric outer layer including a copolymer, which comprises:

a first repeating unit having a moiety capable of interacting with the organic ligand compound bonded to the surface of the quantum dot, the quantum dot surface, or a combination thereof, and a second repeating unit having a reactive moiety.

The outer layer may further include an intermolecular or intramolecular crosslinking moiety that links the reactive moieties of the copolymer.

The crosslinking moiety may be represented by Chemical Formula 1 or Chemical Formula 2:

Chemical Formula 1

$$L\!-\!(\!-A\!-\!*)_n$$

wherein, each A is the same or different and is independently an amide group, an ester group, a thioester group, an ether group, a thioether group, a C1 to C20 alkylene group, a C3 to C20 alkenylene group, or a combination thereof, L is a C1 to C20 aliphatic hydrocarbon group, a C3 to C40 alicyclic hydrocarbon group, or a C6 to C40 aromatic hydrocarbon group,

* is a linking portion to the reactive moiety of the copolymer, and n is an integer ranging from 2 to 7, wherein n is less than or equal to valence of L, Chemical Formula 2

$$*\!-\!A\!-\!(\!-L\!-\!N\!-\!)_m\!-\!L\!-\!A\!-\!*$$
$$\hspace{2.5cm} |$$
$$\hspace{2.5cm} CO$$
$$\hspace{2.5cm} |$$
$$\hspace{2.5cm} *$$

wherein, each A is the same or different and is each independently an amide group, an ester group, a thioester group, an ether group, a thioether group, a C1 to C20 alkylene group, a C3 to C20 alkenylene group, or a combination thereof, each L is the same or different and is independently a C1 to C20 aliphatic hydrocarbon group or a C6 to C40 aromatic hydrocarbon group,

* is a linking portion to the reactive moiety of the copolymer, and m is an integer ranging from 1 to 10.

The first repeating unit may have the moiety in a backbone or as a pendant group of the copolymer, which is capable of interacting with the organic ligand compound bonded to the surface of the quantum dot.

The moiety interacting with the organic ligand compound may be a monovalent or divalent aliphatic hydrocarbon group, a monovalent or divalent aromatic hydrocarbon group, or a monovalent or divalent fluorinated aliphatic hydrocarbon group.

The first repeating unit may be represented by Chemical Formula 3:

Chemical Formula 3

$$*\!-\!\!\begin{matrix} R^3 & R^1 \\ | & | \\ C\!-\!C \\ | & | \\ R^4 & R^2 \end{matrix}\!\!-\!*$$

wherein, $R^1$, $R^2$, $R^3$, and $R^4$ are independently hydrogen, C1 to C20 alkyl group, a C1 to C20 alkyl group substituted with a functional group capable of bonding to the surface of the quantum dot, a C6 to C40 aryl group, a C6 to C40 aryl group substituted with a functional group capable of bonding to the surface of the quantum dot, a C7 to C40 arylalkyl group, a C7 to C40 arylalkyl group substituted with a functional group capable of bonding to the surface of the quantum dot, a C1 to C30 fluoroalkyl group, a C1 to C30 fluoroalkyl group substituted with a functional group capable of bonding to the surface of the quantum dot, a C1 to C30 perfluoroalkyl group, or a C1 to C30 perfluoroalkyl group substituted with a functional group capable of bonding to the surface of the quantum dot, provided that $R^1$, $R^2$, $R^3$ and $R^4$ are not simultaneously hydrogen.

The functional group capable of bonding to the surface of the quantum dot may include —COOH, —NH$_2$, —NH, N, —SH, —PO, P, OH, COOR' (R is a C1 to C10 alkyl group), PO(OH)$_2$, or POOH.

The reactive moiety of the second repeating unit may be present in a backbone of the copolymer or as a pendant group of the copolymer.

The reactive moiety may be a C2 to C20 alkenyl group, a C2 to C20 alkynyl group, an epoxy group, an anhydride group, an imide group, or a combination thereof.

The second repeating unit may be represented by one of Chemical Formula 4 to Chemical Formula 12:

Chemical Formula 4

Chemical Formula 5

Chemical Formula 6

-continued

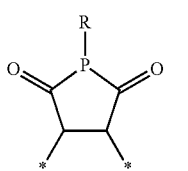

Chemical Formula 7

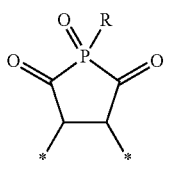

Chemical Formula 8

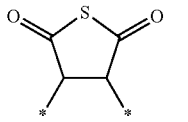

Chemical Formula 9

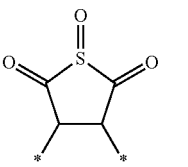

Chemical Formula 10

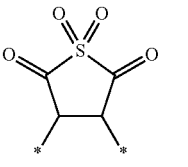

Chemical Formula 11

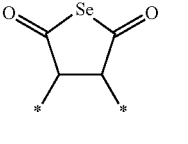

Chemical Formula 12 wherein, in the chemical formulae, R is H, a C1 to C10 alkyl group, or a C6 to C20 aryl group, and \* is a linking portion to an adjacent atom present in a backbone of the copolymer.

The copolymer may be a random copolymer.

The copolymer may include a styrene-maleic anhydride copolymer, a styrene-maleimide copolymer, or a combination thereof.

When the quantum dot complex has the polymeric outer layer according to the aforementioned embodiments, the surface of the quantum dot may be effectively protected from the external environment without any substantial loss of the ligand bonded to the surface of the quantum dot, and thus the stability of the quantum dot may be enhanced. The quantum dot complex having the polymeric outer layer may also be used as a component of a photosensitive composition to provide a pattern of a quantum dot-polymer composite for the preparation of the color filter.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
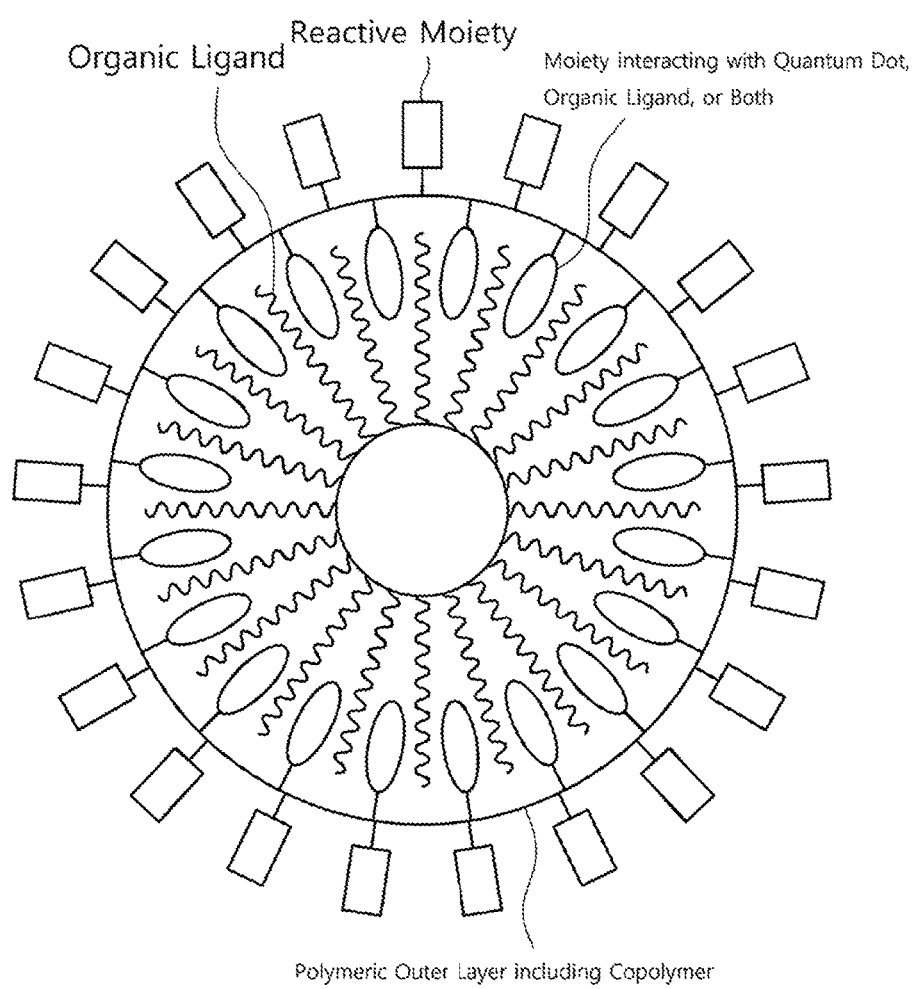
FIG. 1 is a schematic view of a quantum dot complex having a polymeric outer layer according to a non-limiting embodiment.

Advantages and characteristics of this disclosure, and a method for achieving the same, will become apparent referring to the following example embodiments together with the drawings attached hereto. The embodiments, may, however, be embodied in many different forms and should not be construed as being limited to the embodiments set forth herein. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. If not defined otherwise, all terms (including technical and scientific terms) in the specification may be defined as commonly understood by one skilled in the art. The terms defined in a generally-used dictionary should be interpreted as having a meaning that is consistent with their meaning in the context of the relevant art and the present disclosure, and may not be interpreted ideally or overly broadly unless clearly defined. In addition, unless explicitly described to the contrary, the word "comprise" and variations such as "comprises" or "comprising" and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "alkyl group" refers to a group derived from a straight or branched chain saturated aliphatic hydrocarbon having the specified number of carbon atoms and having a valence of at least one.

As used herein, the term "alkoxy group" refers to "alkyl-O—", wherein the term "alkyl" has the same meaning as described above.

As used herein, the term "alkenyl group" may refer to a straight or branched chain, monovalent hydrocarbon group having at least one carbon-carbon double bond.

As used herein, the term "alkynyl group" refers to a straight or branched chain, monovalent hydrocarbon group having at least one carbon-carbon triple bond.

As used herein, the term "cycloalkyl group" refers to a monovalent group having one or more saturated rings in which all ring members are carbon.

As used herein, the term "aryl", which is used alone or in combination, refers to an aromatic hydrocarbon group containing at least one ring and having the specified number of carbon atoms. The term "aryl" may be construed as including a group with an aromatic ring fused to at least one cycloalkyl ring.

As used herein, the term "arylalkyl group" refers to a substituted or unsubstituted aryl group covalently linked to an alkyl group that is linked to a compound.

As used herein, when a definition is not otherwise provided, the term "substituted" refers to a compound or a moiety wherein at least one of hydrogen atoms thereof is substituted with a substituent selected from a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C20 alkyl" refers to a C1 to C20 alkyl group substituted with a C6 to C20 aryl group, the total number of carbon atoms in the resulting aryl substituted alkyl group is C7 to C40.

As used herein, the term "alkylene group" may refer to a straight or branched saturated aliphatic hydrocarbon group having a valence of at least two, and optionally substituted with one or more substituents. As used herein, the term "alkenylene group" may refer to a straight or branched aliphatic hydrocarbon group having a valence of at least two, having at least one double bond, and optionally substituted with one or more substituents. The term "arylene group" may refer to a functional group having a valence of at least two obtained by removal of at least two hydrogens in an aromatic ring, and optionally substituted with one or more substituents.

As used herein, the term "aliphatic organic group" refers to a linear or branched substituted or unsubstituted alkyl group, a linear or branched substituted or unsubstituted alkenyl group, or a linear or branched substituted or unsubstituted alkynyl group.

As used herein, the term "aromatic hydrocarbon group" refers to a substituted or unsubstituted aryl group.

As used herein, the term "(meth)acrylate" refers to acrylate and/or methacrylate.

As used herein, the term "hydrophobic moiety" refers to a moiety that causes a given compound including the same to show agglomeration in an aqueous solution and to have a tendency of repelling water. For example, the hydrophobic moiety may include an aliphatic hydrocarbon group having a carbon number of greater than or equal to 2 (alkyl, alkenyl, alkynyl, etc.), an aromatic hydrocarbon group having a carbon number of greater than or equal to 6 (phenyl, naphthyl, arylalkyl group, etc.), or an alicyclic hydrocarbon group of having a carbon number of greater than or equal to 5 (cyclohexyl, norbornene, etc.). The hydrophobic moiety substantially lacks an ability of making a hydrogen bond with an ambient medium and is not substantially mixed with the medium as its polarity is not matched with that of the medium.

As used herein, the term "group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

As used herein, the term "blue light conversion rate" refers to a ratio of emitted light with respect to incident light. In some embodiments, the blue light conversion rate may be a ratio of emitted light amount of the quantum dot polymer composite to the absorbed light amount thereof from the excitation light (e.g., blue light), A total amount of the excitation light (e.g., a total amount of the blue light, B) may be obtained by integrating a photoluminescent spectrum of the excitation light. A PL spectrum of the quantum dot polymer composite is obtained and from the PL spectrum thus obtained, an amount of the blue light (B') and an amount of the light (A) that is emitted from the quantum dot polymer composite and has a green and/or red wavelength range are measured, respectively. Then, the light conversion rate is calculated by the following equation:

$$A/(B-B') \times 100 = \text{light conversion rate (\%)}.$$

As used herein, the term "dispersion" refers to a dispersion wherein a dispersed phase is a solid and a continuous phase includes a liquid. For example, the term "dispersion" may refer to a colloidal dispersion wherein the dissolved or dispersed phase has a dimension of about 1 nm to about 1 micrometer (μm).

In an embodiment, a photosensitive composition includes a quantum dot complex having a polymeric outer layer (for example, a plurality of the quantum dot complexes);

a carboxylic acid group (—COOH)-containing binder;

a photopolymerizable monomer having a carbon-carbon double bond;

a photoinitiator; and a solvent.

The polymeric outer layer includes a copolymer having a first repeating unit having a moiety capable of interacting with a surface of the quantum dot, an organic ligand compound bonded to the surface of the quantum dot, or a combination thereof, and a second repeating unit having a reactive moiety.

The plurality of the quantum dot complexes may be dispersed (for example, separated from one another) by the carboxylic acid group (—COOH)-containing polymer to form a quantum dot dispersion. The quantum dot dispersion includes the carboxylic acid group (—COOH)-containing polymer and the plurality of quantum dots dispersed in the carboxylic acid group (—COOH)-containing polymer. The quantum dot dispersion may further include a solvent.

In an embodiment, the quantum dot is not particularly limited and may include a known or commercially available quantum dot. For example, the quantum dot may be a Group II-VI compound, a Group III-V compound, a Group IV-VI compound, a Group IV compound, a Group I-III-VI compound, a Group I-II-IV-VI compound, or a combination thereof.

The Group II-VI compound may be selected from:

a binary element compound selected from CdSe, CdTe, ZnS, ZnSe, ZnTe, ZnO, HgS, HgSe, HgTe, MgSe, MgS, and a combination thereof;

a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group II-VI compound may further include a Group III metal.

The Group III-V compound may be selected from:

a binary element compound selected from GaN, GaP, GaAs, GaSb, AlN, AlP, AlAs, AlSb, InN, InP, InAs, InSb, and a combination thereof;

a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group III-V compound may further include a Group II metal (e.g., InZnP).

The Group IV-VI compound may be selected from:

a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbTe, SnPbS, SnPbSe, SnPbTe, and a combination thereof; and a quaternary element compound selected from SnPbSSe, SnPbSeTe, SnPbSTe, and a combination thereof.

The Group compound may include $CuInSe_2$, $CuInS_2$, CuInGaSe, and CuInGaS but is not limited thereto.

The Group I-II-IV-VI compound may include CuZnSnSe, and CuZnSnS but is not limited thereto.

The Group IV element or compound may include:

a single-element selected from Si, Ge, and a combination thereof; and a binary element compound selected from SiC, SiGe, and a combination thereof.

The binary element compound, the ternary element compound or the quaternary element compound may be respectively included in a uniform concentration in the particle or partially different concentrations in the same particle. In addition, the semiconductor nanocrystal particle may have a core-shell structure wherein a first semiconductor nanocrystal is surrounded by a second semiconductor nanocrystal different from the first semiconductor nanocrystal. The Interface between the core and the shell may have a concentration gradient wherein the concentration of an element of the shell decreases toward the core. In addition, the semiconductor nanocrystal particle may have a semiconductor nanocrystal core and a multi-layered shell surrounding the semiconductor nanocrystal core. The multi-layered shell structure has at least two layers wherein each layer may be a single composition, an alloy, or the one having a concentration gradient.

In the semiconductor nanocrystal particle, the materials of the shell may have a larger energy bandgap than that of the core, and thereby the semiconductor nanocrystal may exhibit a quantum confinement effect more effectively. In case of a multi-layered shell type of semiconductor nanocrystal particle, the bandgap of the material of an outer layer may be higher energy than that of the material of an inner layer (a layer that is closer to the core). In this case, the semiconductor nanocrystal may emit light of a wavelength ranging from UV to infrared light.

The semiconductor nanocrystal may have a quantum yield (QY) of greater than or equal to about 10%, greater than or equal to about 30%, for example, greater than or equal to about 50%, greater than or equal to about 60%, greater than or equal to about 70%, or greater than or equal to about 90%.

For use in display devices, the semiconductor nanocrystal may have a narrower FWHM so as to realize enhanced color purity or color reproducibility. The semiconductor nanocrystal particle may have a FWHM of less than or equal to about 45 nanometers (nm), for example less than or equal to about 40 nm, or less than or equal to about 30 nm. While not wishing to be bound by theory, it is understood that within the aforementioned ranges, a device including the semiconductor nanocrystal particle may exhibit enhanced color purity or improved color reproducibility.

The quantum dot may have a particle diameter (an average largest particle diameter for a non-spherical shape) of about 1 nm to about 100 nm. For example, the quantum dot may have a particle diameter (an average largest particle diameter for a non-spherical shape) of about 1 nm to about 20 nm, for example, about 2 nm (or about 3 nm) to about 15 nm.

The shape of the quantum dot may have a generally available shape in this art so is not particularly limited. For example, the quantum dot may have spherical, pyramidal, multi-armed, or cubic nanoparticles, nanotubes, nanowires, nanofibers, nanoplate particles, or the like.

The quantum dot is commercially available or may be synthesized according to any method. For example, the quantum dots having a size of several nanometers may be synthesized according to a wet chemical process. In the wet chemical process, precursors react in an organic solvent to grow nanocrystal particles, and the organic solvent or a ligand compound may coordinate to the surface of the semiconductor nanocrystal, thereby controlling the growth of the nanocrystal. Examples of the organic solvent and ligand compound are known. The organic solvent coordinated to the surface of the quantum dot may affect stability of a device, and thus excess organic materials that are not coordinated to the surface of the quantum dot may be removed by pouring the quantum dot into excessive non-solvent, and centrifuging the resulting mixture. Examples of the non-solvent may be acetone, ethanol, methanol, and the like, but are not limited thereto. After the removal of extra organic materials, the amount of the organic materials coordinated to the surface of the quantum dot may be less than or equal to about 50 percent by weight (wt %), for example, less than or equal to about 30 wt %, less than or equal to about 20 wt %, or less than or equal to about 10 wt % based on the total weight of the quantum dot. The organic material may include a ligand compound, an organic solvent, or a combination thereof.

The quantum dot may have an organic ligand bonded to the surface of the quantum dot. In an embodiment, the organic ligand may have a hydrophobic moiety. The organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 aliphatic hydrocarbon group or a C5 to C20 aromatic hydrocarbon group), or a combination thereof.

Examples of the organic ligand compound bonded to the surface of the quantum dot may include:

a thiol compound such as methane thiol, ethane thiol, propane thiol, butane thiol, pentane thiol, hexane thiol, octane thiol, dodecane thiol, hexadecane thiol, octadecane thiol, or benzyl thiol;

an amine compound such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

a phosphine compound such as methyl phosphine, ethyl phosphine, propyl phosphine, butyl phosphine, pentyl phosphine, octyl phosphine, dioctyl phosphine, tributylphosphine, or trioctylphosphine;

a phosphine oxide compound such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, or trioctylphosphine oxide;

diphenyl phosphine, triphenylphosphine compound or an oxide thereof;

C5 to C20 alkyl phosphinic acid compound such as hexylphosphinic acid, octylphosphinic acid, dodecanephosphinic acid, tetradecanephosphinic acid, hexadecanephosphinic acid, or octadecanephosphinic acid;

and the like, but are not limited thereto.

The quantum dot may include the organic ligand (e.g., the hydrophobic organic ligand) alone or as a combination of at least two compounds.

In the composition, an amount of the quantum dot including the organic ligand bonded to the surface thereof may be greater than or equal to about 1 wt %, for example, greater than or equal to about 5 wt %, or greater than or equal to about 10 wt %, based on the total amount of the composition. The amount of the quantum dot including the organic ligand bonded to the surface thereof may be less than or equal to about 40 wt %, for example, less than or equal to about 35 wt % based on the total amount of the composition.

Quantum dot has a theoretical quantum yield (QY) of about 100% and may emit light having a high color purity (e.g., full width at half maximum (FWHM) of less than or equal to about 40 nm), so it may achieve the enhanced luminous efficiency and the improved color reproducibility. Accordingly, when using a color filter including a quantum dot polymer composite, it is expected to realize a display having a high brightness, a wide viewing angle, and high color reproducibility. In order to apply quantum dots for a color filter, the quantum dot-polymer composite is subjected to a patterning process, but during the patterning process, the performance of quantum dots may be deteriorated by the external environment. During the patterning process, the organic ligand bonded to the surface of quantum dot tends to be detached off, and this may cause defects on the surface of quantum dot and the deterioration of external quantum efficiency (EQE). In addition, the surface defects of the quantum dot may act as a light emitting quenching trap and may provide a starting point of the quantum dot oxidation. Therefore, it is important to stabilize quantum dot.

According to an embodiment, the quantum dot complex having a polymeric outer layer is adopted in the patterning process of a photoluminescent-type quantum dot color filter to effectively protect the surface of the quantum dot. In other words, provided is a polymeric outer layer having a first repeating unit that is capable of participating in an intermolecular reaction with the quantum dot and the organic ligand compound bonded to the surface thereof. A reactivity of the second repeating unit is provided onto the surface of the quantum dots so as to enhance the quantum dot stability to the external environment (oxygen in air, moisture, heat) (FIG. 1).

Referring to FIG. 1, the polymeric outer layer includes a copolymer including:

a first repeating unit having a moiety which interacts intermolecularly with at least one of the quantum dots and the organic ligand bonded to the quantum dot surface; and a second repeating unit having a reactive moiety.

Because the reactivity of the reactive moiety may significantly increase when the outer layer is formed on the surface of quantum dot, the copolymer of the polymeric outer layer may readily react with a cross-linking agent that will be described below. In other words, the copolymer itself has a low level of reactivity with the cross-linking agent, but it may react with the cross-linking agent under relatively mild conditions when it forms an outer layer surrounding quantum dot. Without wishing to be bound by any theory, it is believed that the first repeating units intermolecularly interact with the quantum dot surface and/or the organic ligand, and thus are arranged in the interior part of the polymeric outer layer while the reactive moiety of second repeating unit is arranged in the exterior part of the polymeric outer layer, and thereby the reactivity of the moiety of the second repeating unit towards the cross-linking agent may be enhanced.

Figure 2:
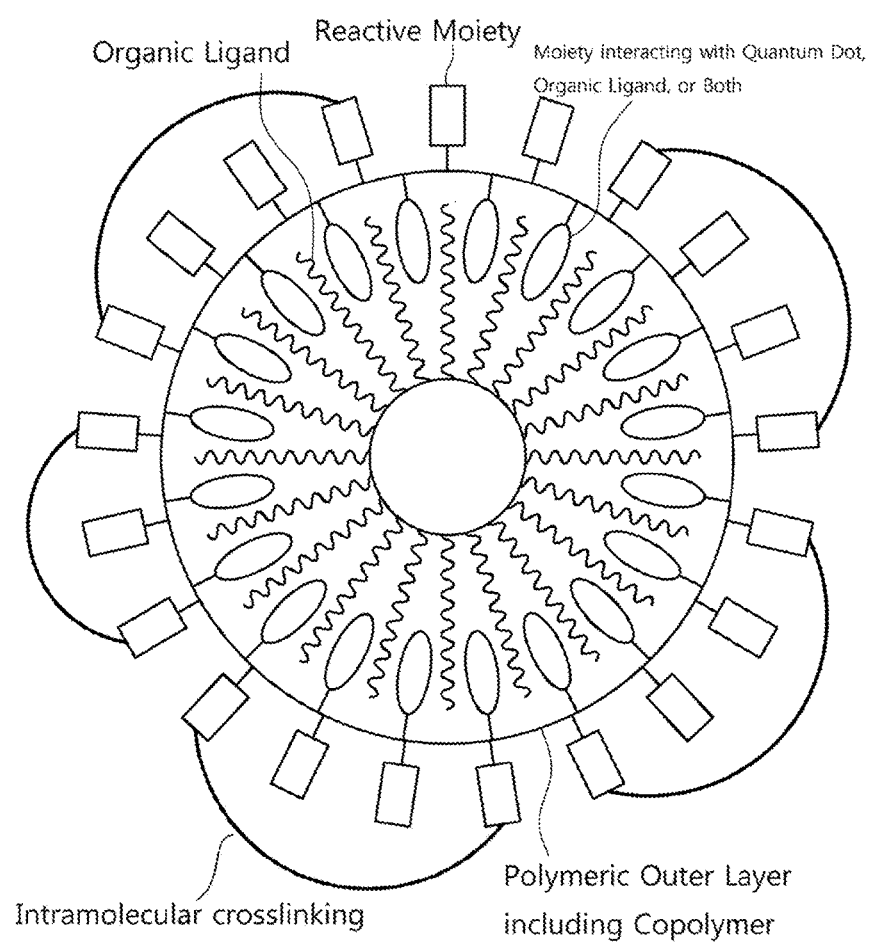
FIG. 2 is a schematic view of a quantum dot complex having a polymeric outer layer according to another non-limiting embodiment.
Figure 3:
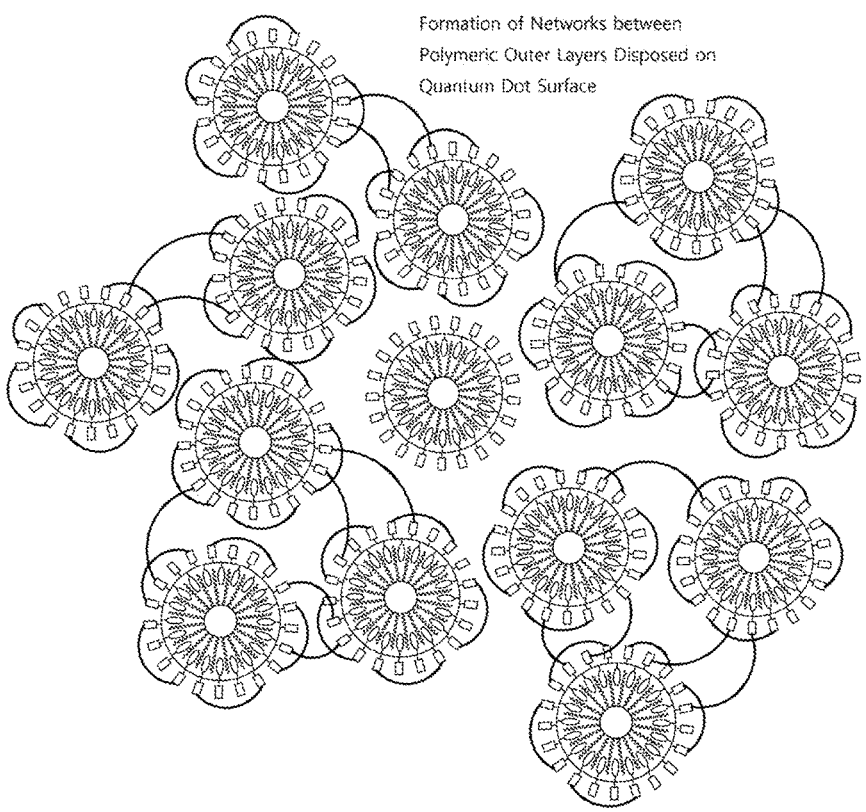
FIG. 3 is a schematic view of a cluster of quantum dots having a polymeric outer layer according to a non-limiting embodiment.

That is, referring to FIG. 2 and FIG. 3, the reaction with the reactive moieties of the copolymer may cause the polymeric outer layer of the quantum dot to further include intermolecular or intramolecular crosslinking moieties connecting the reactive moieties. When the reactive moiety of polymeric outer layer is reacted with an appropriate cross-linking agent, the reactive moieties present in a single chain of the polymeric outer layer may be connected with each other via the cross-linking agent to provide an intramolecular crosslinking moiety (FIG. 2). Alternatively, when the reactive moiety of the copolymer is reacted with an appropriate cross-linking agent, the reactive moieties present in two or more copolymer chains may be connected with each other via the cross-linking agent to provide an intermolecular crosslinking moiety, and thereby, it may also provide a network between the polymeric outer layers surrounding quantum dot. By the presence of such crosslinking moieties, the quantum dot may have enhanced stability against the external environment.

The crosslinking moiety may be represented by Chemical Formula 1 or Chemical Formula 2:

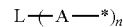

Chemical Formula 1 wherein, each A is the same or different and is independently an amide group (—C(=O)—NR—, wherein R is hydrogen or a C1 to C10 alkyl group), an ester group (—C(=O)—O—), a thioester group (—C(=S)—O—), an ether group (—O—), a thioether group (—S—), a C1 to C20 alkylene group, a C3 to C20 alkenylene group, or a combination thereof, L is a C1 to C20 aliphatic hydrocarbon group (e.g., a C1 to C20 alkylene group such as a methylene group, a propylene group, a butylene group, a pentylene group, and a hexylene group), a C3 to C40 alicyclic hydrocarbon group (e.g., C3 to C20 cycloalkylene such as cyclohexylene and norbornene), or a C6 to C40 aromatic hydrocarbon group (arylene such as phenylene),

* is a linking portion to the reactive moiety of the copolymer, and n is an integer ranging from 2 to 7, wherein n is less than or equal to valence of L.

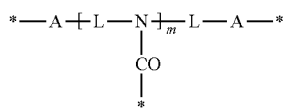

Chemical Formula 2 wherein, each A is the same or different and is independently an amide group, an ester group, a thioester group, an ether group, a thioether group, a C1 to C20 alkylene group, a C3 to C20 alkenylene group, or a combination thereof, each L is the same or different and is independently a C1 to C20 aliphatic hydrocarbon group, a C3 to C40 alicyclic hydrocarbon group, or C6 to C40 aromatic hydrocarbon group,

* is a linking portion to the reactive moiety of the copolymer, and m is an integer ranging from 1 to 10.

For example, the crosslinking moiety may be represented by Chemical Formula 1-1, Chemical Formula 1-2, or Chemical Formula 1-3:

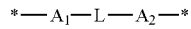

Chemical Formula 1-1

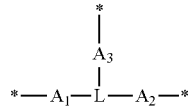

Chemical Formula 1-2

-continued

Chemical Formula 1-3

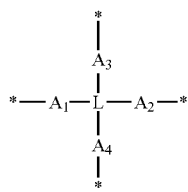

wherein, $A_1$, $A_2$, $A_3$, and $A_4$ are the same or different and are each independently an amide group, an ester group, a thioester group, an ether group, a thioether group, a C1 to C20 alkylene group, a C3 to C20 alkenylene group, or a combination thereof, L is a C1 to C20 aliphatic hydrocarbon group or a C6 to C40 aromatic hydrocarbon group, and

* is a linking portion to the reactive moiety of the copolymer.

For example, the crosslinking moiety may be represented by Chemical Formula 2-1:

Chemical Formula 2-1

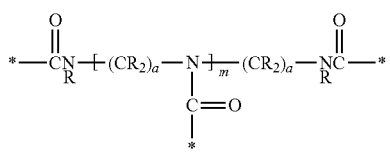

wherein, each R is the same or different and is independently hydrogen or a C1 to C10 alkyl group;

a is a number between one and ten, and

* is a linking portion to the reactive moiety of the copolymer.

The first repeating unit may have a moiety in a backbone or as a pendant group of the copolymer, which is capable of interacting with the surface of the quantum dot, the organic ligand bonded to the surface of the quantum dot, or a combination thereof.

The first repeating unit may be represented by Chemical Formula 3:

Chemical Formula 3

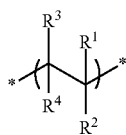

wherein, $R^1$, $R^2$, $R^3$, and $R^4$ are independently hydrogen, C1 to C20 alkyl group, a C1 to C20 alkyl group substituted with a functional group capable of bonding to the surface of the quantum dot, a C6 to C40 aryl group, a C6 to C40 aryl group substituted with a functional group capable of bonding to the surface of the quantum dot, a C7 to C40 arylalkyl group, a C7 to C40 arylalkyl group substituted with a functional group capable of bonding to the surface of the quantum dot, a C1 to C30 fluoroalkyl group, a C1 to C30 fluoroalkyl group substituted with a functional group capable of bonding to the surface of the quantum dot, a C1 to C30 perfluoroalkyl group, or a C1 to C30 perfluoroalkyl group substituted with a functional group capable of bonding to the surface of the quantum dot, provided that $R^1$, $R^2$, $R^3$ and $R^4$ are not simultaneously hydrogen.

For example, the first repeating unit may be a polystyrene moiety.

The second repeating unit may have the reactive moiety present in a backbone of the copolymer or as a pendant group of the copolymer. The reactive moiety may be a C2 to C20 alkenyl group, a C2 to C20 alkynyl group, an epoxy group, an anhydride group, an imide group, or a combination thereof.

In an embodiment, the second repeating unit may be represented by one of Chemical Formula 4 to Chemical Formula 12:

Chemical Formula 4

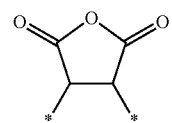

Chemical Formula 5

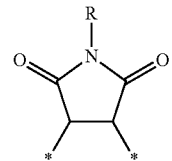

Chemical Formula 6

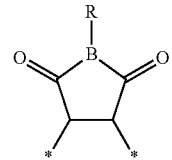

Chemical Formula 7

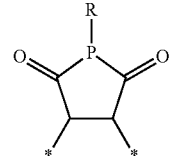

Chemical Formula 8

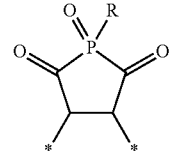

Chemical Formula 9

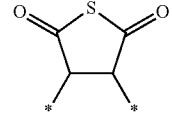

Chemical Formula 10

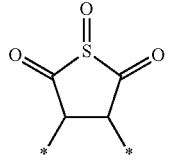

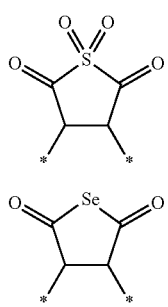

Chemical Formula 11

Chemical Formula 12 wherein, in the chemical formulae, R is H, a C1 to C10 alkyl group, or a C6 to C20 aryl group, and wherein * is a linking portion to an adjacent atom present in a backbone of the copolymer.

The copolymer may include a random copolymer.

The copolymer may include a styrene-maleic anhydride copolymer, a styrene-maleimide copolymer, or a combination thereof.

Figure 4:
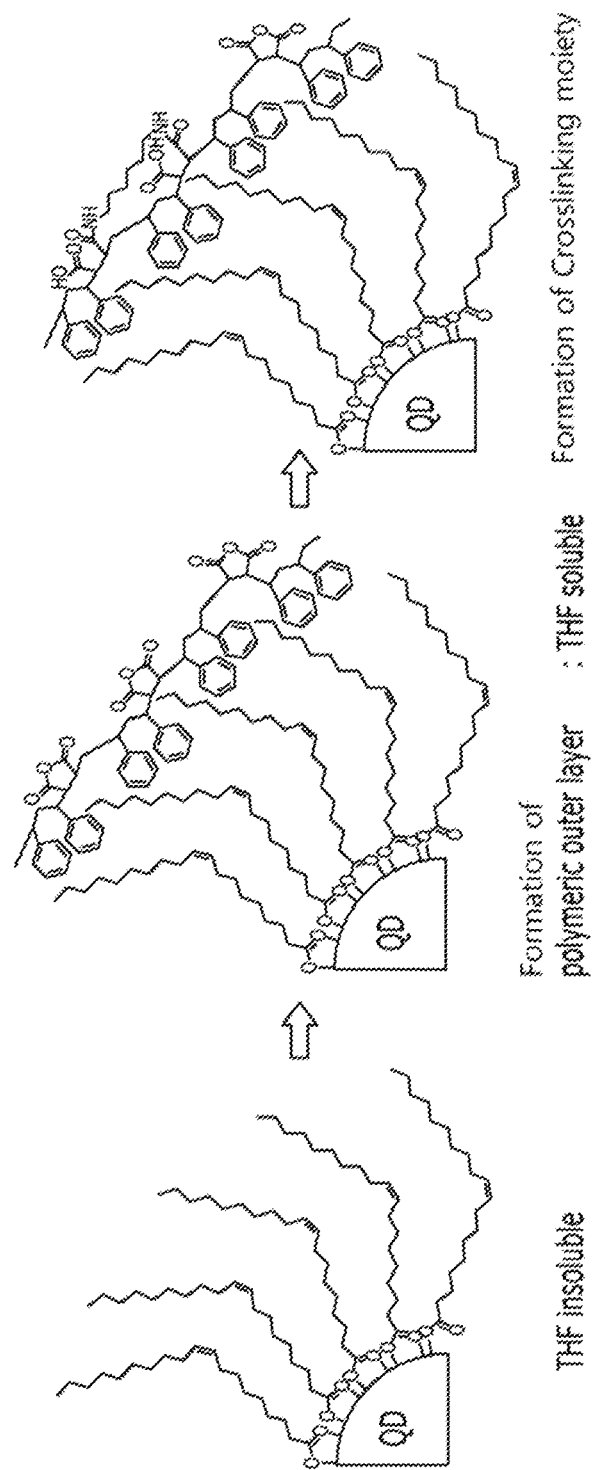
FIG. 4 is a schematic view showing a process of preparing a quantum dot complex having a polymeric outer layer according to a non-limiting embodiment.

Although a process for preparing a quantum dot complex having a polymeric outer layer is illustrated with a styrene-maleic anhydride copolymer as the copolymer as an example, it is not limited thereto. Types of solvent and the specific reaction conditions may be selected appropriately based on the types of a copolymer constituting the polymeric outer layer (e.g., reactive moiety, intermolecular interacting group, the kind of cross-linking agent, or the like) and quantum dots and ligands bonded to the surface of the quantum dots, and the like. Referring to FIG. 4, the quantum dot complex having an organic ligand of oleic acid on the surface is insoluble in some organic solvents (e.g., tetrahydrofuran). When the quantum dots are dissolved in an appropriate organic solvent (e.g., chloroform) and reacted with the copolymer at a temperature, for example, about 20 to about 60° C. for a predetermined time, a polymer outer layer of styrene-maleic anhydride copolymer is formed on the surface of quantum dot, and thus the quantum dots become soluble in a tetrahydrofuran solvent.

Subsequently, when quantum dots having a polymeric outer layer are reacted with an appropriate cross-linking agent (e.g., diamine compound) for a predetermined time, quantum dots including a crosslinking moiety within a copolymer of the same molecule or between copolymers of different molecules may be prepared. The quantum dots may have an improved stability to the external environment (e.g., heat).

The reaction temperature for providing a polymeric outer layer is not particularly limited and may be appropriately selected considering the nature of the reaction. For example, the reaction may be performed at a temperature of about 20° C. to about 120° C., but is not limited thereto. The reaction time for preparation of a polymeric outer layer is not particularly limited, and may be selected appropriately. For example, the reaction may be performed for greater than or equal to about 1 minute, for example, about 10 minutes to about 12 hours, but is not limited thereto.

The reaction temperature for providing a crosslinking moiety is not particularly limited and may be appropriately selected considering the nature of the reaction. For example, the reaction may be performed at about 20° C. to about 120° C., but is not limited thereto. Also, the reaction time for providing a crosslinking moiety is not particularly limited, and may be appropriately selected. For example, the reaction may be performed for greater than or equal to about 1 minute, for example, from about 10 minutes to about 12 hours, but it is not limited thereto.

The molecular weight of the copolymer for providing a polymeric outer layer is not particularly limited, and may be appropriately selected. For example, the number average molecular weight of copolymer may be about 1,000 to about 20,000, for example, about 3,000 to about 15,000, but is not limited thereto.

In the copolymer forming a polymeric outer layer, the ratio between a first repeating unit and a second repeating unit may be also appropriately adjusted. For example, the ratio between a first repeating unit and a second repeating unit (first repeating unit: second repeating unit) is within a range of about 1:0.1 to about 1:10, for example, about 1:0.25 to about 1:2, or about 1:0.4 to about 1:1, but is not limited thereto. According to an embodiment, the copolymer may be a random copolymer.

The cross-linking agent for providing a crosslinking moiety may be selected based on the reactive moiety of the copolymer. For example, the cross-linking agent may be represented by Chemical Formula A or Chemical Formula B:

Chemical Formula A wherein, each A' is the same or different and is independently an amine group, a hydroxy group, a mercapto group, or a C3 to C30 alkenyl or alkynyl group including a carbon-carbon double bond or a carbon-carbon triple bond at the terminal end, and n and L are the same as defined in Chemical Formula 1.

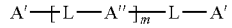

Chemical Formula B wherein,

A' is NH$_2$, A'' is —NH—, and m and L are the same as defined in Chemical Formula 2.

As non-limiting examples, the cross-linking agent may include a diamine compound such as hexamethylenediamine and octamethylenediamine. As other non-limiting examples, the cross-linking agent may include a triamine compound such as bis(hexamethylene)triamine and polyamine such as tetraethylenepentamine.

The amount of the cross-linking agent may be appropriately selected considering the content of desirable crosslinking moiety and may be not particularly limited. For example, the amount of cross-linking agent may be used to provide a reactive group (i.e., A' and A'') in greater than or equal to 0.1 moles (mol), for example, about 0.1 mol to about 2 mol per 1 mol of a reactivity moiety of the copolymer, but is not limited thereto.

As a method of forming a pattern including quantum dots in conventional arts, U.S. Pat. No. 7,199,393 discloses that quantum dots having a photosensitive functional group on the surface thereof are used in the patterning method, the entire content of which is incorporated herein by reference. In the conventional method, a photosensitive functional group is introduced onto the surface of quantum dot and subjected to a photopolymerization, if desired together with photopolymerizable monomer, to provide a quantum dot-polymer composite pattern. But this method requires an additional process of a surface treatment of quantum dots and necessarily needs the developing process using an organic solvent to form a pattern.

In order to provide an alkali-developable quantum dot-polymer composite pattern, when quantum dots (e.g., in which organic ligand is bonded to the surface) are mixed with the alkali-developable photoresist without performing the surface treatment, the quantum dots have insufficient compatibility with photoresist, so quantum dots are not dispersed and are agglomerated. For the application of the patterned quantum dot-polymer composite in a color filter, a large amount of quantum dots may be included in the composite, but in order to form a pattern thereof, the quantum dots may have to be uniformly dispersed.

In some embodiments, the quantum dot complex having the aforementioned polymeric outer layer may have an improved dispersibility to the organic solvent or the conventional alkali-developable photoresist, they may provide the photosensitive composition in a relatively simple manner. In some non-limiting embodiments, the photosensitive composition may be prepared by preliminarily dispersing the quantum dot complex including the polymeric outer layer (e.g., having a hydrophobic moiety) in a COOH group-containing binder solution having a hydrophobic moiety and then mixing the obtained quantum dot-binder dispersion with the other components for providing a photoresist. In this case, the quantum dot complex may be better dispersed in an alkali-developable photoresist, and thus an increased amount of the quantum dots may be dispersed more easily. Without wishing to be bound by any theory, it is believed that the quantum dot complex having the aforementioned polymeric outer layer on a surface of the quantum dot may have an improved dispersibility into an organic solvent, and thereby may stably maintain their dispersed state even in the alkali developable photoresist composition.

Therefore, the photosensitive composition according to an embodiment further includes a carboxylic acid group (—COOH)-containing binder, wherein the carboxylic acid group-containing binder is a copolymer of the monomer combination including the first monomer having a carboxylic acid group and a carbon-carbon double bond and the second monomer having a carbon-carbon double bond and a hydrophobic moiety but including no carboxylic acid group. Thus, the plurality of quantum dots are dispersed (e.g., separated to each other) by the carboxylic acid group-containing binder. As the photosensitive composition according to an embodiment may provide a quantum dot-polymer composite pattern even when the quantum dot has no photopolymerizable functional group (e.g., carbon-carbon double bond such as (meth)acrylate) on its surface, it becomes possible to avoid the surface treatment of the quantum dots and the use of the organic developing solvent.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may be one or more compounds.

Examples of the second monomer may include, but are not limited to:

an alkenyl aromatic compound such as styrene, α-methyl styrene, vinyl toluene, or vinyl benzyl methyl ether;

an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

N-phenylmaleimide, N-benzylmaleimide, or N-alkylmaleimide;

an unsaturated carbonic acid aminoalkyl ester compound such as 2-aminoethyl acrylate, 2-aminoethyl methacrylate, 2-dimethylamino ethyl acrylate, or 2-dimethylaminoethyl methacrylate;

an unsaturated carbonic acid glycidyl ester compound such as glycidyl acrylate, or glycidyl methacrylate;

a vinyl cyanide compound such as acrylonitrile, or methacrylonitrile; and an unsaturated amide compound such as acryl amide and methacrylamide.

The second monomer may be one or more compounds.

The carboxylic acid group-containing binder may have an acid value of greater than about 50 milligrams of KOH per gram (mg KOH/g) in order to disperse a quantum dot, but the acid value may vary depending on a chemical structure (e.g., a chemical structure of a main chain or a hydrophobic moiety at the side chain) of the binder. For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The carboxylic acid group-containing binder may have an acid value of, for example, less than or equal to about 200 mg KOH/g, for example, less than or equal to about 190 mg KOH/g, less than or equal to about 180 mg KOH/g, or less than or equal to about 160 mg KOH/g, without limitation. The quantum dots may be mixed with a binder-containing solution having the acid value within the above ranges to provide a quantum dot-binder dispersion. The obtained quantum dot-binder dispersion may have the improved compatibility with the other components for the photoresist (e.g., photopolymerizable monomer, photoinitiator, solvent, etc., which will be explained later), so quantum dots may be sufficiently dispersed in the final composition (i.e., photoresist composition) to form a pattern. In an embodiment, the carboxylic acid group-containing binder may have an acid value of about 100 mg KOH/g to about 200 mg KOH/g.

The carboxylic acid group-containing binder may include a copolymer of a monomer combination that further includes a third monomer having a carbon-carbon double bond and a hydrophilic moiety and not having a carboxylic acid group.

Examples of the third monomer may include 2-hydroxyethyl acrylate, 2-hydroxyethyl methacrylate, 2-hydroxybutyl acrylate, and 2-hydroxybutyl methacrylate, but are not limited thereto. The third monomer may be one or more compounds.

In an embodiment, the carboxylic acid group-containing binder may include a copolymer of (meth)acrylic acid and at least one second monomer selected from arylalkyl(meth)acrylate, hydroxyalkyl (meth)acrylate and styrene.

In the carboxylic acid group-containing binder, an amount of a first repeating unit derived from the first monomer may be greater than or equal to about 10 mole percent (mol %), for example, greater than or equal to about 15 mol %, greater than or equal to about 25 mol %, or greater than or equal to about 35 mol %. In the carboxylic acid group-containing binder, an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the carboxylic acid group-containing binder, an amount of a second repeating unit derived from the second monomer may be greater than or equal to about 10 mol %, for example, may be greater than or equal to about 15 mol %, may be greater than or equal to about 25 mol %, or may be greater than or equal to about 35 mol %. In the carboxylic acid group-containing binder, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

In the carboxylic acid group-containing binder, an amount of a third repeating unit derived from the third monomer may be greater than or equal to about 1 mol %, for example, greater than or equal to about 5 mol %, greater than or equal to about 10 mol %, or greater than or equal to about 15 mol %. In the carboxylic acid group-containing binder, an amount of the third repeating unit may be less than or equal to about 30 mol %, for example, less than or equal to about 25 mol %, less than or equal to about 20 mol %, less than or equal to about 15 mol %, or less than or equal to about 10 mol %.

The carboxylic acid group-containing binder may include a copolymer of (meth)acrylic acid; and at least one second monomer selected from arylalkyl(meth)acrylate, hydroxyalkyl (meth)acrylate, and styrene. In some embodiments, the carboxylic acid group-containing binder may include a methacrylic acid/methyl methacrylate copolymer, a methacrylic acid/benzyl methacrylate copolymer, methacrylic acid/benzyl methacrylate/styrene copolymer, a methacrylic acid/benzyl methacrylate/2-hydroxyethyl methacrylate copolymer, or a methacrylic acid/benzyl methacrylate/styrene/2-hydroxy ethyl methacrylate copolymer.

The carboxylic acid group-containing binder may have a weight average molecular weight of greater than or equal to about 1,000 g/mol, for example, greater than or equal to about 2,000 g/mol, greater than or equal to about 3,000 g/mol, or greater than or equal to about 5,000 g/mol. The carboxylic acid group-containing binder may have a weight average molecular weight of less than or equal to about 100,000 g/mol, for example, less than or equal to about 50,000 g/mol. Within the above ranges, good developability may be ensured.

In the photosensitive composition, an amount of the carboxylic acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on the total weight of the composition. An amount of the carboxylic acid group-containing binder may be less than or equal to about 40 wt %, for example, less than or equal to about 30 wt % based on the total weight of the composition. In an embodiment, an amount of the carboxylic acid group-containing binder may be 5 to 40 wt % based on the total weight of solids (i.e., non-volatiles) of the composition. Within the above ranges, appropriate developability and proccessability may be implemented in a subsequent pattern forming process while ensuring dispersion of quantum dot.

A photosensitive composition according to an embodiment includes a photopolymerizable monomer having a carbon-carbon double bond. The photopolymerizable monomer may include any monomer having a carbon-carbon double bond, which is polymerizable and the types thereof are not limited thereto. For example, the photopolymerizable monomer may include a monomer or oligomer widely used in the photosensitive resin composition, and may be monofunctional or multi-functional esters of (meth)acrylic acid having at least one ethylenic unsaturated double bond. For example, the photopolymerizable monomer may include a vinyl monomer, an unsaturated ethylene oligomer, a homopolymer thereof, or a copolymer of the unsaturated ethylene oligomer and an ethylenic unsaturated monomer. Examples of the photopolymerizable monomer may include ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxyacrylate, bisphenol A di(meth)acrylate, trimethylolpropane tri(meth)acrylate, novolacepoxy (meth)acrylate, ethylene glycol monomethyl ether (meth)acrylate, tris(meth)acryloyloxyethyl phosphate, or propylene glycol di(meth)acrylate, but are not limited thereto. In an embodiment, the photopolymerizable monomer may include a di(meth)acrylate compound, a tri(meth)acrylate compound, a tetra(meth)acrylate compound, a penta(meth)acrylate compound, a hexa(meth)acrylate compound, or a combination thereof.

In the photosensitive composition, an amount of the photopolymerizable monomer may be greater than or equal to about 0.5 wt %, for example, greater than or equal to about 1 wt %, or greater than or equal to about 2 wt % based on the total weight of the composition. An amount of the photopolymerizable monomer is less than or equal to about 20 wt %, for example, less than or equal to about 10 wt % based on the total weight of the composition.

The photosensitive composition includes a photoinitiator. The photopolymerizable initiator is not particularly limited, and can be appropriately selected. For example, the available photoinitiator may include a triazine compound, an acetophenone compound, a benzophenone compound, a thioxanthone compound, a benzoin compound, an oxime compound, or a combination thereof, but are not limited thereto.

Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine,2-(4'-methoxynaphthyl)-4,6-bis(trichloro methyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis (trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-trichloromethyl (piperonyl)-6-triazine, and 2,4-(trichloromethyl(4'-methoxy styryl)-6-triazine, but are not limited thereto.

Examples of the acetophenone compound may be 2,2'-diethoxyacetophenone, 2,2'-dibutoxyacetophenone, 2-hydroxy-2-methylpropinophenone, p-t-butyltrichloroacetophenone, p-t-butyldichioroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto. Examples of the benzophenone compound may be benzophenone, benzoyl benzoate, benzoyl methyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may include thioxanthone, 2-methylthioxanthone, 2-iso-propylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin iso-propyl ether, benzoin iso-butyl ether, benzyl dimethyl ketal, and the like, but are not limited thereto.

Examples of the oxime compound may include 2-(o-benzoyloxime)-1-[4-(phenylthio)phenyl]-1,2-octanedione and 1-(o-acetyloxime)-1-[9-ethyl-6-(2-methylbenzoyl)-9H-carbazol-3-yl]ethanone, and the like, but are not limited thereto.

The photoinitiator may be also a carbazole compound, a diketone compound, a sulfonium borate compound, a diazo compound, a di-imidazole compound, and the like, in addition to the photoinitiators.

In the photosensitive composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In an embodiment, the amount of the photoinitiator may be about 0.05 to about 10 wt % based on the total weight of solids (i.e., non-volatiles) of the composition. Within the above ranges, a desirable pattern may be formed.

If desired, the photosensitive composition may further include various additives such as a light diffusing agent, a leveling agent, or a coupling agent in addition to the aforementioned components. The amount of the additive is not particularly limited and may be controlled within an appropriate range wherein the additive does not make an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide particulates, or zinc oxide particle, and metal particles such as gold, silver, copper, or platinum, but is not limited thereto.

The leveling agent is aimed to prevent stains or spots and to improve planarization and leveling characteristics of a film, and examples may include the following but are not limited thereto.

A fluorine-containing leveling agent may include commercial products, for example BM-1000®, and BM-1100® (BM Chemie Inc.); MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, and SF-8428®, and the like of Toray Silicone Co., Ltd.).

Types and amounts of the additives may be adjusted if desired.

The coupling agent is aimed to increase adherence with a pattern and glass and resolution, and examples thereof may include a silane-containing coupling agent. Examples of the silane-containing coupling agent may include vinyl trimethoxysilane, vinyl tris (2-methoxyethoxy)silane, 3-glycidoxypropyl trimethoxysilane, 2-(3,4-epoxycyclohexyl) ethyl trimethoxysilane, 3-chloropropylmethyl dimethoxysilane, 3-chloropropyl trimethoxysilane, 3-methacryloxylpropyl trimethoxysilane, 3-mercaptopropyl trimethoxysilane, and the like.

The photosensitive composition includes a solvent. An amount of the solvent may be determined depending on the amounts of the above main components (i.e., the organic ligand-containing quantum dot, COOH group-containing binder, the photopolymerizable monomer combination, the photoinitiator), and additives. In the photosensitive composition according to the embodiments, the balance amount of the composition other than the amounts of the solid (i.e., non-volatile) components may be the amount of the solvent. The solvent may be selected appropriately considering its affinity for other components (e.g., the binder, the photopolymerizable monomer, the photoinitiator, and other additives), its affinity for alkali developing solution, and its boiling point. Examples of the solvent may include:

ethyl 3-ethoxy propionate;

an ethylene glycol such as ethylene glycol, diethylene glycol, or polyethylene glycol;

a glycol ether such as ethylene glycol monomethyl ether, ethylene glycol monoethyl ether, diethylene glycol monomethyl ether, ethylene glycol diethyl ether, or diethylene glycol dimethyl ether;

a glycol ether acetate such as ethylene glycol acetate, ethylene glycol monoethyl ether acetate, diethylene glycol monoethyl ether acetate, or diethylene glycol monobutyl ether acetate;

a propylene glycol such as propylene glycol;

a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether;

a propylene glycol ether acetate such as propylene glycol monomethyl ether acetate, or dipropylene glycol monoethyl ether acetate;

an amides such as N-methylpyrrolidone, dimethyl formamide, or dimethyl acetamide; a ketones such as methyl ethyl ketone (MEK), methyl iso-butyl ketone (MIBK), or cyclohexanone;

a petroleum product such as toluene, xylene, or solvent naphtha;

an ester such as ethyl acetate, butyl acetate, or ethyl lactate;

an ether such as diethyl ether, dipropyl ether, or dibutyl ether; and a combination thereof.

A method of preparing a photosensitive composition according to an embodiment includes:

providing a binder solution including the carboxylic acid group (—COOH)—containing binder and the solvent;

dispersing the quantum dots having a polymeric outer layer into the binder solution to obtain a quantum dot-binder dispersion; and combining the quantum dot-binder dispersion with at least one of the photoinitiator; the photopolymerizable monomer, and the solvent.

A method of preparing a photosensitive composition according to another embodiment includes:

mixing the quantum dots having a polymeric outer layer with at least one of the binder solution, the photoinitiator, the photopolymerizable monomer, and the solvent.

A combining order or combining method are not particularly limited and may be appropriately adopted. For example, each component may be combined sequentially or simultaneously.

The preparing method may further include selecting the quantum dot complex having a polymeric outer layer, and selecting the carboxylic acid group-containing binder in which the quantum dots are dispersable. In the step of selecting the binder, the binder may be a carboxylic acid group-containing binder, and the carboxylic acid group-containing binder may include a copolymer of the monomer combination including the first monomer having a carboxylic acid group and a carbon-carbon double bond and the second monomer having a carbon-carbon double bond and a hydrophobic moiety and not having a carboxylic acid group, wherein chemical structure and acid values of the copolymer may be considered.

The quantum dot complex having a polymeric outer layer, the carboxylic acid group-containing binder, the photopolymerizable monomer, and the photoinitiator are the same as described above.

The photosensitive composition of the aforementioned embodiments may be developed using an alkali aqueous solution, and thus when the photosensitive composition is used, a quantum dot-polymer composite pattern may be formed without using an organic solvent developing solution.

Figure 5:
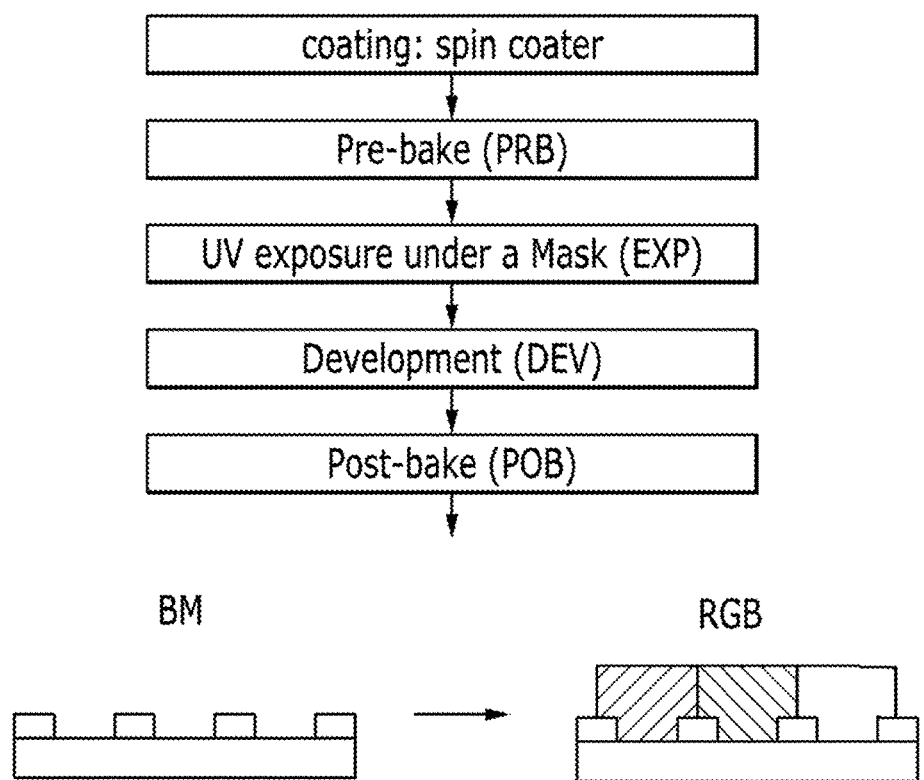
FIG. 5 is a flow diagram schematically showing a pattern forming process using a photosensitive composition according to a non-limiting embodiment.

A non-limiting method of forming a pattern is explained referring to FIG. 5.

The photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as a spin coating, a slit coating and the like to form a film of a predetermined thickness (e.g., thickness of 3 to 30 micrometers, μm). The formed film may be pre-baked, if desired. The specific conditions of pre-baking such as a temperature, a time, and an atmosphere are known in the art and may be selected appropriately.

The formed (or, optionally pre-baked) film is exposed to light of a predetermined wavelength under a mask having a predetermined pattern. The wavelength and the intensity of the light may be selected based on the types and the amounts of photoinitiator, and the types and the amounts of quantum dot or the like.

The exposed film may be treated with an alkali developing solution, and thereby the unexposed region in the film may be dissolved to provide a desirable pattern. The obtained pattern may be post-baked, if desired, to improve the crack resistance and the solvent resistance of the pattern, for example, at a temperature of about 150° C. to about 230° C. for a predetermined time (e.g., greater than or equal to about 10 minutes or greater than or equal to about 20 minutes). Even in the case of performing the post-bake process, the pattern obtained from the photosensitive composition may show improved thermal stability so that the light conversion rate may be maintained at greater than or equal to about 40% of the initial value.

When a quantum dot-polymer composite obtained from the photosensitive composition is prepared for the use as a color filter, two or three types of photosensitive compositions including a red quantum dot, a green quantum dot, (or optionally, a blue quantum dot) are prepared, and the patterning process is repeated for each composition to provide a quantum dot-polymer composite having a desirable pattern.

Accordingly, another embodiment provides a quantum dot-polymer composite pattern obtained from the photosensitive composition.

The quantum dot, the binder, and the photopolymerizable monomer are the same as described above.

Another embodiment relates to quantum dot complex, wherein the quantum dot complex includes an organic ligand bonded to the surface of the quantum dot and further includes an outer layer including a copolymer having a first repeating unit including a moiety that is capable of interacting with the surface of the quantum dot, the organic ligand bonded to the surface of the quantum dot, or a combination thereof, and a second repeating unit having a reactive moiety.

The polymeric outer layer may further include an intermolecular or intramolecular crosslinking moiety connecting (linking) the reactive moieties by a reaction with the reactive moieties of the copolymer.

Details of the quantum dots, the organic ligand bonded to the surface of the quantum dot, the first repeating unit, the second repeating unit, the polymeric outer layer, and the crosslinking moiety and details of the manufacturing method thereof are the same as set forth above.

The nanoparticles synthesized by a chemical wet process are stabilized by a ligand covering the surface of the quantum dot. When the ligand is substituted with a ligand having different characteristic, or is fabricated into a thin film or a polymer composite, or when a device including the quantum dot is operated, the quantum dots may lose the ligand attached to their surface, which in turn may change the chemical composition and physical characteristics of the quantum dots, thus making it difficult to ensure the stability thereof. The conventional organic ligand passivation cannot avoid losing the organic ligand originally attached to the quantum dots, and this may lead to the surface change or the agglomeration of the quantum dots. On the contrary, the quantum dot complex having a polymeric outer layer may enhance the stability of nanoparticles by surrounding the nanoparticle surface with the polymer that may have the intermolecular or intramolecular crosslinking moiety without substituting the ligand originally bonded to the nanoparticle surface. The aforementioned quantum dot complex having the polymeric outer layer may have an improved compatibility with the patterning composition and may effectively protect quantum dots from the external environment during the patterning process, so they find their use in the field of the patterning composition.

Hereinafter, the embodiments are illustrated in more detail with reference to examples. However, they are exemplary embodiments, and the present disclosure is not limited thereto.

EXAMPLES

Analysis:
[1] TGA Analysis:
Thermo-gravimetric analysis is performed using a thermo-gravimetric analyzer (manufactured by Mettler Toledo, model name: sdt (mettler)).

[2] GPC Analysis:

GPC analysis is performed using a gel permeation chromatography (manufactured by Waters, model name: GPC2690).

[3] FT-IR Analysis:

FT-IR analysis is performed using a Fourier transfer infrared ray spectrometer (manufactured by: BIO RAD Co., Ltd., model name: Excalibur).

Reference Example

Preparation of Quantum Dot (1) 0.2 millimoles (mmol) of indium acetate, 0.6 mmol of palmitic acid, 10 milliliters (mL) of 1-octadecene are placed into a reactor and heated at 120° C. under the vacuum. After 1 hour, the atmosphere in the reactor is substituted with nitrogen. After heating at 280° C., a mixed solution of 0.1 mmol of tris(trimethylsilyl)phosphine (TMS$_3$P) and 0.5 mL of trioctylphosphine is rapidly injected and reacted for 20 minutes. Acetone is placed into the reaction solution, which has been rapidly cooled to a room temperature, and centrifuged to provide a precipitate, and the precipitate is dispersed into toluene. The obtained InP semiconductor nanocrystal has a UV first absorption maximum wavelength of about 420 to about 600 nanometers (nm).

0.3 mmol (0.056 g) of zinc acetate, 0.6 mmol (0.189 g) of oleic acid, and 10 mL of trioctylamine are placed into a reaction flask and vacuumed at 120° C. for 10 minutes. N$_2$ is substituted in the reaction flask and heated up to about 220° C. Toluene dispersion (OD:0.15) of InP semiconductor nanocrystal and 0.6 mmol of S/TOP (a sulfur dispersion/solution in trioctylphosphine) are placed into the reaction flask, heated at 280° C., and reacted for 30 minutes. After the reaction, the reaction solution is rapidly cooled to a room temperature to provide a reaction product including a InP/ZnS semiconductor nanocrystal.

(2) Excessive amount of ethanol is added into the reaction product including the InP/ZnS semiconductor nanocrystal and centrifuged to remove the excessive organic material present on the semiconductor nanocrystal as prepared. Supernatant is discarded after the centrifuge, and the precipitate is re-dissolved in hexane, and added with the excessive amount of ethanol and centrifuged again. The centrifuged precipitate is dried and then dispersed in chloroform.

Example 1

Quantum dots are separated from 500 mL of semiconductor nanocrystal chloroform dispersion (optical density: 0.3-0.5) obtained from Reference Example and dissolved into 50 mL of chloroform, and 6.5 g (molecular weight: 1,600, purchasing place: Aldrich, trade name: poly(styrene-co-maleic anhydride), cumene terminated) of poly(styrene-co-maleic anhydride) is added thereto and agitated at 50° C. for 3 hours. Chloroform is removed from the obtained reactant to provide quantum dots including an outer layer of poly(styrene-co-maleic anhydride), and the complex is dispersed in THF.

Example 2

QD-Polymer: Cross-Linking Agent=1:1

Quantum dots are separated from 500 mL of the semiconductor nanocrystal chloroform dispersion [optical density: 0.3 to 0.5] obtained from Reference Example and dissolved in 50 mL of chloroform, and 6.5 g of poly(styrene-co-maleic anhydride) is added thereto and agitated at 50° C. for 3 hours. 952 milligrams (mg) of hexamethylene diamine is added thereto and treated with ultrasonic at a room temperature for 20 minutes.

Chloroform is removed from the ultrasonicated reactant to provide a resultant including a quantum dot complex having a polymeric outer layer having an intermolecular or intramolecular crosslinking moiety. The obtained products are dispersed in THF and added to hexane to be precipitated. Subsequently, the obtained precipitate is dispersed in THF, again. The unreacted reactant is removed by repeating the process once or more than once to provide quantum dots having a polymeric outer layer having an intermolecular or intramolecular crosslinking moiety.

Example 3

QD-Polymer: Cross-Linking Agent=1:0.5

Quantum dot complex having a polymeric outer layer having an intermolecular or intramolecular crosslinking moiety are prepared in accordance with the same procedure as in Example 2, except that 476 mg of hexamethylene diamine is used.

Example 4

QD-Polymer: Cross-Linking Agent=1:0.35

Quantum dot complex having a polymeric outer layer having an intermolecular or intramolecular crosslinking moiety are prepared in accordance with the same procedure as in Example 2, except that 333 mg of hexamethylene diamine is used.

Example 5

QD-Polymer: Cross-Linking Agent=1:0.2

Quantum dot complex having a polymeric outer layer having a crosslinking moiety between molecules or in molecules are prepared in accordance with the same procedure as in Example 2, except that 190 mg of hexamethylene diamine is used.

Example 6

QD-Polymer: Cross-Linking Agent=1:0.1

Quantum dot complex having a polymeric outer layer having an intermolecular or intramolecular crosslinking moiety are prepared in accordance with the same procedure as in Example 2, except that 95 mg of hexamethylene diamine is used.

Experimental Example 1

TGA Analysis

Figure 6:
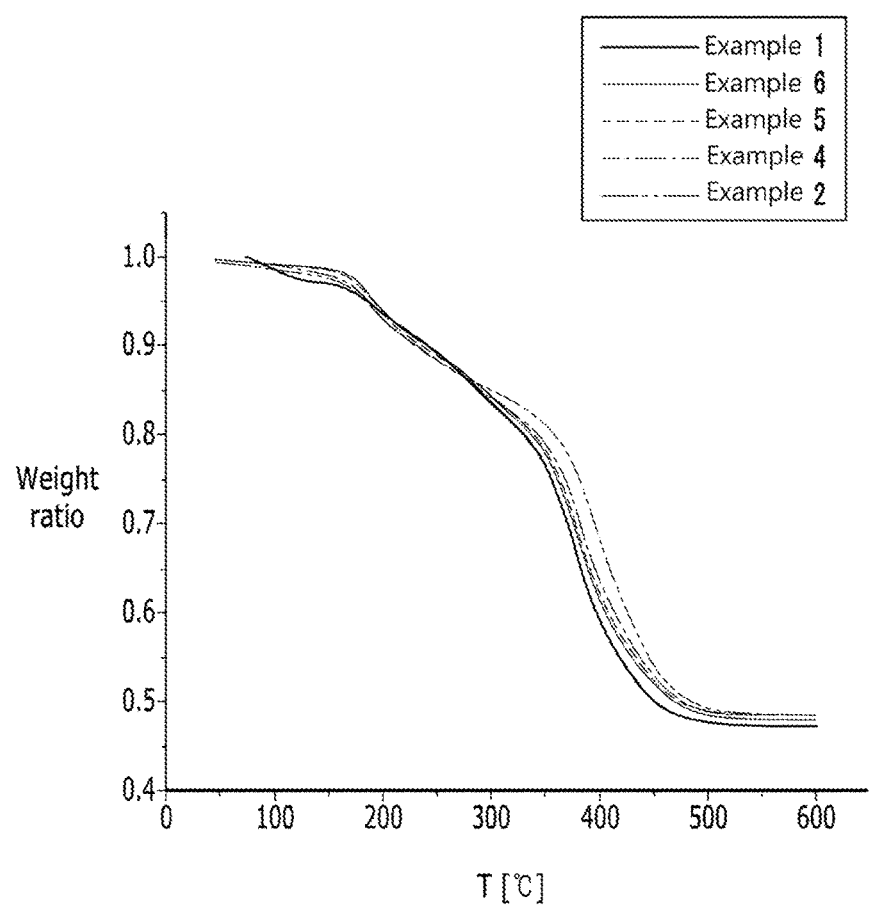
FIG. 6 is a graph of weight ratio versus temperature (degrees Centigrade, °C.) showing thermogravimetric analysis results of a quantum dot complex having a polymeric outer layer prepared in the Examples.

The products obtained from Examples 1, 2, 4, 5, and 6 are subjected to a thermogravimetric analysis, and the results are shown in FIG. 6. From the results of FIG. 6, it is determined that the main decomposition temperature is increased by the cross-linking of polymeric outer layer. The results suggest that the thermal stability of quantum dots may be improved by forming the crosslinking moiety.

Experimental Example 2

GPC Analysis

The products obtained from Examples 2, 3, 5, and 6 are performed with a gel permeation chromatography analysis, and the results are shown in Table 1:

It is determined that the molecular weight changes according to increasing the content of cross-linking agent.

TABLE 1

| | QD-polymer:cross-linking agent | Mn | Mw | PDI |
|---|---|---|---|---|
| Example 6 | 1:0.1 | $2.38 \times 10^4$ | $4.00 \times 10^4$ | 1.69 |
| Example 5 | 1:0.2 | $2.89 \times 10^4$ | $6.42 \times 10^4$ | 2.30 |
| Example 3 | 1:0.5 | $1.51 \times 10^4$ | $6.01 \times 10^4$ | 3.99 |
| Example 2 | 1:1 | $3.69 \times 10^4$ | $5.30 \times 10^4$ | 1.43 |

Experimental Example 3

FT IR Spectroscopy

Figure 7:
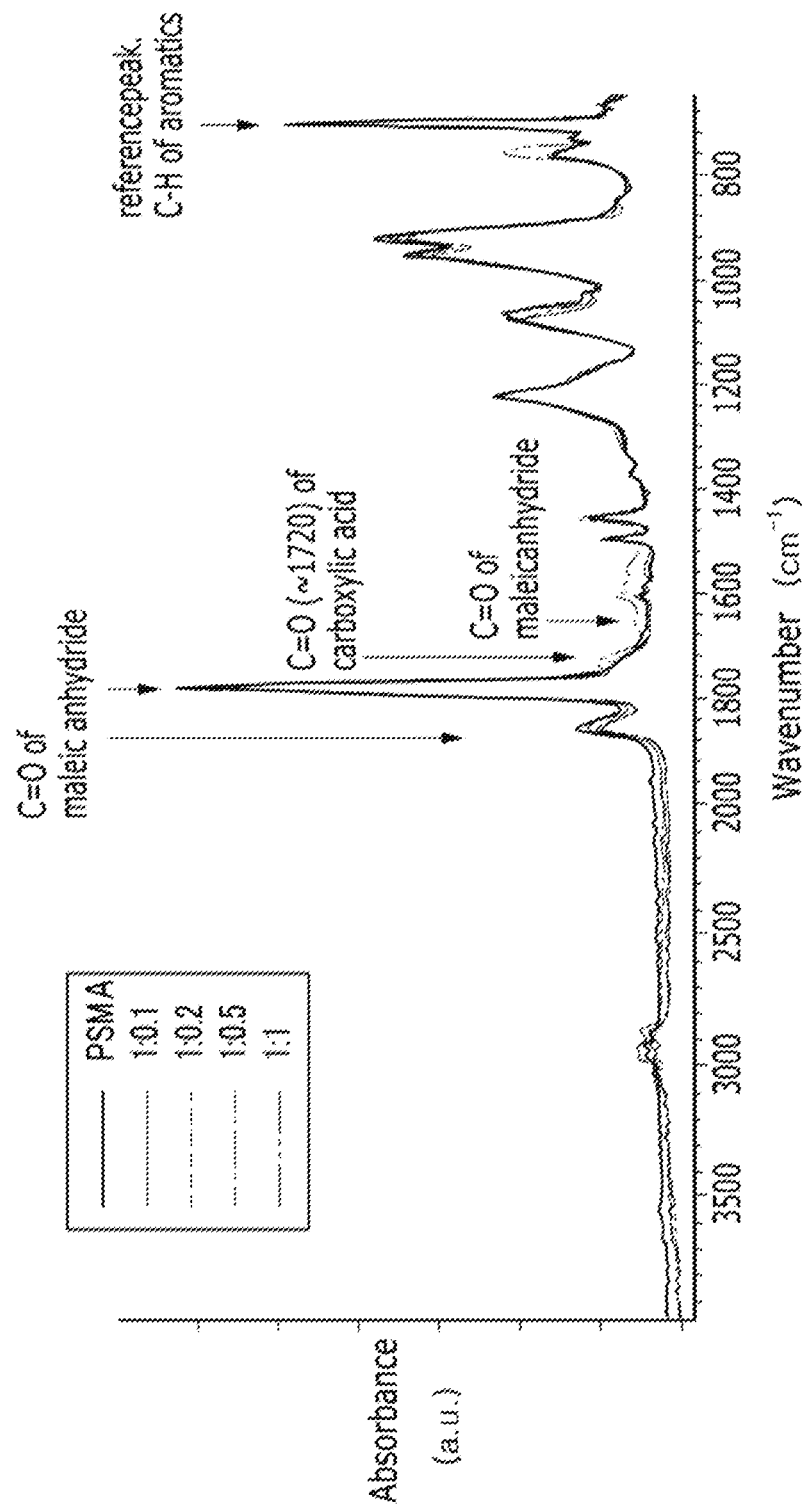
FIG. 7 is a graph of absorbance (arbitrary units, a. u.) versus wavenumber (reverse centimeters, $cm^{-1}$) showing FT IR analysis results for the mixture of the copolymer and the cross-linking agent in Experimental Example 2.

[1] Poly(styrene-co-maleic anhydride) and hexamethylene diamine are dissolved in chloroform in the same amounts as in Examples 2, 3, 5, and 6 and treated with ultrasonic at 50° C. for 20 minutes. The treated product is performed with a FT-IR spectroscopy using an infrared ray spectrometer (manufacturer: BIO RAD, model name: Excalibur), and the results are shown in FIG. 7. From the results of FIG. 7, it is determined that the content of the reaction products of amine and anhydride is very little.

Figure 8:
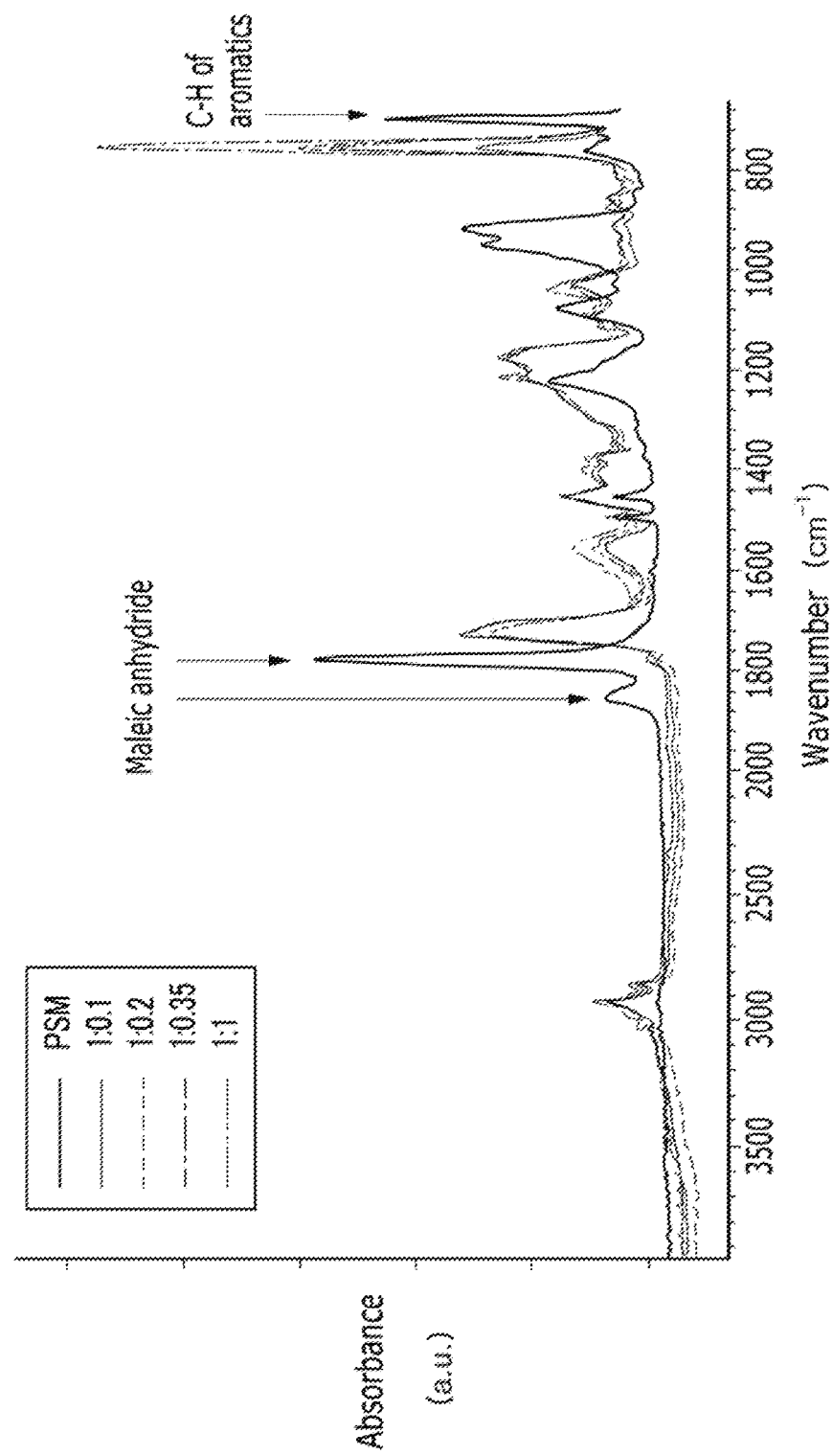
FIG. 8 is a graph of absorbance (arbitrary units, a. u.) versus wavenumber (reverse centimeters, $cm^{-1}$) showing FT IR analysis results for the quantum dots having a polymeric outer layer prepared according to the Examples in Experimental Example 2.

[2] The products obtained from Examples 2, 3, 5, and 6 are performed with a FT-IR spectroscopy, and the results are shown in FIG. 8. From the results of FIG. 8, it is determined that in the polymeric outer layer placed on the quantum dot surface, the amount of anhydride is significantly decreased, and the amount of cross-linking reaction products (amide group and carboxylic acid group) is significantly increased by performing a reaction of hexamethylene diamine with maleic anhydride group.

Example 7

Preparation of Quantum Dot-Polymer Composite Pattern

Chloroform solution including 50 g of the quantum dots having a polymeric outer layer obtained from Example 3 is mixed with 100 g of a binder (quaternary copolymer of methacrylic acid, benzyl methacrylate, hydroxyethyl methacrylate and styrene (acid value: 60 mg KOH/g, weight average molecular weight: 5,000, methacrylic acid:benzyl methacrylate:hydroxyethyl methacrylate:styrene (mole ratio)=61.5%:12%:16.3%:10.2%) solution (polypropylene glycol monomethyl ether acetate having a concentration of 30 wt %) to provide a quantum dot-binder dispersion:

100 g of hexaacrylate having the following structure as a photopolymerizable monomer, 1 g of oxime ester compound as an initiator, and 300 g of PGMEA 300 are mixed into the obtained quantum dot binder dispersion to provide a photosensitive composition.

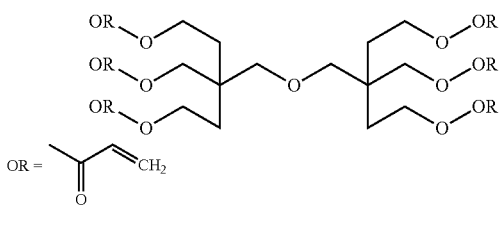

The obtained photosensitive composition is spin-coated on a glass substrate to provide a film. The obtained film is pre-baked at 100° C. The blue light conversion rate of the pre-baked (PRB) film is measured. The pre-baked film is irradiated with light (wavelength: 365 nm, intensity: 100 millijoules, mJ) under a mask having a predetermined pattern for 1 second, and developed with a potassium hydroxide aqueous solution (concentration: 0.043%) for 50 seconds to provide a pattern.

The obtained pattern is heated at 180° C. for 30 minutes for 3 times as a Post Bake (POB) treatment, and the blue light conversion rate is measured for each case, and from the results, a process maintenance ratio ("blue conversion rate after the PRB/blue conversion rate after the POB") is calculated and compiled in Table 2.

Example 8

Preparation of Quantum Dot-Polymer Composite Pattern

Quantum dot-polymer composite pattern is obtained in accordance with the same procedure as in Example 7, except that the chloroform solution including 50 g of the quantum dots having a polymeric outer layer obtained from Example 6 is used.

The obtained pattern is heated at 180° C. for 30 minutes for 3 times as a Post Bake (POB) treatment, and the blue light conversion rate is measured in each case, and from the results, a process maintenance ratio is calculated and compiled in Table 2.

Comparative Example

Preparation of Quantum Dot-Polymer Composite Pattern

Quantum dot-polymer composite pattern is obtained in accordance with the same procedure as in Example 7, except that chloroform solution including 50 g of quantum dots includes no polymeric outer layer (i.e., Reference Example) is used.

The obtained pattern is heated at 180° C. for 30 minutes for 3 times as a Post Bake (POB) treatment, and the blue light conversion rate is measured for each case, and from the results, a process maintenance ratio is calculated and compiled in Table 2.

TABLE 2

| | Comparative Example | Example 7 | Example 8 |
|---|---|---|---|
| POB first process maintenance ratio | 62% | 89% | 107% |
| POB second process maintenance ratio | 56% | 89% | 110% |
| POB third process maintenance ratio | 50% | 92% | 113% |

From the results of Table 2, it is determined that the patterns including quantum dots according to Examples (i.e., quantum dots having a polymeric outer layer) have higher process maintenance ratio compared to the quantum dots including no polymeric outer layer.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A photosensitive composition comprising:
a quantum dot complex comprising a polymeric outer layer;
a carboxylic acid group-containing binder;
a photopolymerizable monomer comprising a carbon-carbon double bond;
a photoinitiator; and
a solvent,
wherein the polymeric outer layer comprises a copolymer comprising:
a first repeating unit comprising: a moiety capable of interacting with a surface of the quantum dot, an organic ligand compound bonded to the surface of the quantum dot, or a combination thereof, and
a second repeating unit comprising a reactive moiety selected from the group consisting of a C2 to C20 alkenyl group, a C2 to C20 alkynyl group, an epoxy group, a thiol group, an anhydride group represented by Chemical Formula 4, an imide group represented by Chemical Formula 5, a group represented by any of Chemical Formula 6 to Chemical Formula 12, and a combination thereof:

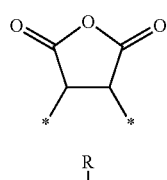

Chemical Formula 4

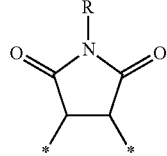

Chemical Formula 5

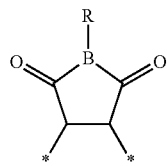

Chemical Formula 6

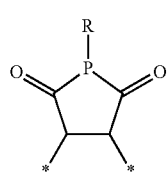

Chemical Formula 7

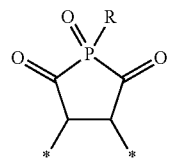

Chemical Formula 8

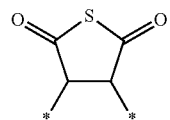

Chemical Formula 9

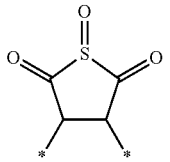

Chemical Formula 10

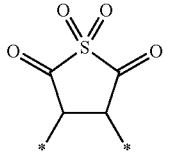

Chemical Formula 11

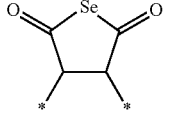

Chemical Formula 12 wherein, in the chemical formulae, R is H, a C1 to C10 alkyl group, or a C6 to C20 aryl group, and

* is a linking portion to an adjacent atom present in a backbone of the copolymer.

2. The photosensitive composition of claim 1, wherein the polymeric outer layer of the quantum dot further comprises an intermolecular or intramolecular crosslinking moiety that links the reactive moieties of the copolymer.

3. The photosensitive composition of claim 2, wherein the crosslinking moiety is represented by Chemical Formula 1 or Chemical Formula 2:

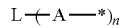

Chemical Formula 1 wherein, each A is the same or different and is independently an amide group, an ester group, a thioester group, an ether group, a thioester group, a C1 to C20 alkylene group, a C3 to C20 alkenylene group, or a combination thereof, L is a C1 to C20 aliphatic hydrocarbon group, a C3 to C40 alicyclic hydrocarbon group, or C6 to C40 aromatic hydrocarbon group,

* is a linking portion to the reactive moiety of the copolymer, and n is an integer ranging from 2 to 7, wherein n is less than or equal to valence of L,

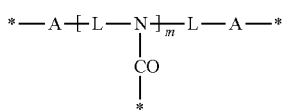

Chemical Formula 2 wherein,
each A is the same or different and is independently an amide group, an ester group, a thioester group, an ether group, a thioether group, a C1 to C20 alkylene group, a C3 to C20 alkenylene group, or a combination thereof,
each L is the same or different and is independently a C1 to C20 aliphatic hydrocarbon group or a C6 to C40 aromatic hydrocarbon group,
* is a linking portion to the reactive moiety of the copolymer, and
m is an integer ranging from 1 to 10.

4. The photosensitive composition of claim 1, wherein the first repeating unit comprises a moiety in a backbone or as a pendant group of the copolymer, which is capable of interacting with the surface of the quantum dot, the organic ligand compound bonded to the surface of the quantum dot, or a combination thereof.

5. The photosensitive composition of claim 1, wherein the moiety capable of interacting with the organic ligand compound bonded to the surface of the quantum dot is a monovalent or divalent aliphatic hydrocarbon group, a monovalent or divalent aromatic hydrocarbon group, or a monovalent or divalent fluorinated aliphatic hydrocarbon group.

6. The photosensitive composition of claim 1, wherein the first repeating unit is represented by Chemical Formula 3:

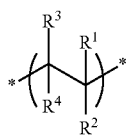

Chemical Formula 3 wherein, $R^1$, $R^2$, $R^3$, and $R^4$ are each independently hydrogen, C1 to C20 alkyl group, a C1 to C20 alkyl group substituted with a functional group capable of bonding to the surface of the quantum dot, a C6 to C40 aryl group, a C6 to C40 aryl group substituted with a functional group capable of bonding to the surface of the quantum dot, a C7 to C40 arylalkyl group, a C7 to C40 arylalkyl group substituted with a functional group capable of bonding to the surface of the quantum dot, a C1 to C30 fluoroalkyl group, a C1 to C30 fluoroalkyl group substituted with a functional group capable of bonding to the surface of the quantum dot, a C1 to C30 perfluoroalkyl group, or a C1 to C30 perfluoroalkyl group substituted with a functional group capable of bonding to the surface of the quantum dot, provided that $R^1$, $R^2$, $R^3$ and $R^4$ are not simultaneously hydrogen.

7. The photosensitive composition of claim 1, wherein the reactive moiety of the second repeating unit is present in a backbone or as a pendant group of the copolymer.

8. The photosensitive composition of claim 1, wherein the copolymer is a random copolymer.

9. The photosensitive composition of claim 1, wherein the copolymer is a styrene-maleic anhydride copolymer, a styrene-maleimide copolymer, or a combination thereof.

10. The photosensitive composition of claim 1, wherein the organic ligand compound comprises RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 aliphatic hydrocarbon group or a C6 to C20 aromatic hydrocarbon group), or a combination thereof.

11. The photosensitive composition of claim 1, wherein the quantum dot comprises Group II-VI compound, Group III-V compound, Group IV-VI compound, Group IV element or compound, Group I-III-VI compound, Group I-II-IV-VI compound, or a combination thereof.

12. The photosensitive composition of claim 1, wherein the carboxylic acid group-containing binder has an acid value of greater than or equal to about 50 milligrams of KOH per gram.

13. The photosensitive composition of claim 1, wherein the photosensitive composition is developable by an alkali aqueous solution after exposure.

14. The photosensitive composition of claim 1, wherein the photosensitive composition comprises:
about 1 percent by weight to about 40 percent by weight of the quantum dot complex comprising a polymeric outer layer;
about 0.5 percent by weight to about 35 percent by weight of the carboxylic acid group-containing binder;
about 0.5 percent by weight to about 20 percent by weight of the photopolymerizable monomer; and
about 0.01 percent by weight to about 10 percent by weight of the photoinitiator; and
a balance amount of the solvent
based on the total weight of the composition.

15. A quantum dot-polymer composite pattern, which is a product of a method comprising:
coating the composition of claim 1 on a substrate to form a film;
selectively exposing the film; and
developing the selectively exposed film with an alkali aqueous solution.

16. An electronic device comprising the quantum dot-polymer composite pattern of claim 15.

17. A quantum dot complex comprising:
an organic ligand compound bonded to the surface of the quantum dot, and
a polymeric outer layer comprising a copolymer, which comprises;
a first repeating unit comprising a moiety capable of intermolecularly interacting with the organic ligand compound, the quantum dot surface, or a combination thereof, and
a second repeating unit comprising a reactive moiety selected from the group consisting of a C2 to C20 alkenyl group, a C2 to C20 alkynyl group, an epoxy group, a thiol group, an anhydride group represented by Chemical Formula 4, an imide group represented by Chemical Formula 5, a group represented by any of Chemical Formula 6 to Chemical Formula 12, and a combination thereof:

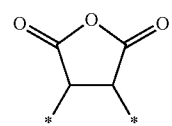

Chemical Formula 4

Chemical Formula 5
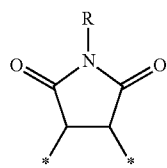

Chemical Formula 6
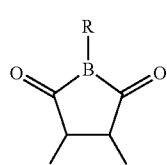

Chemical Formula 7
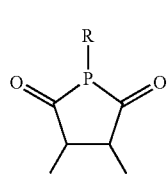

Chemical Formula 8
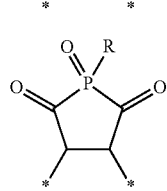

Chemical Formula 9
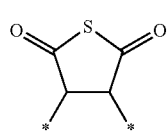

Chemical Formula 10
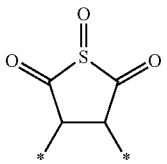

Chemical Formula 11
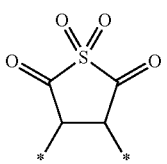

Chemical Formula 12
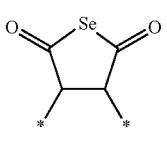

wherein, in the chemical formulae, R is H, a C1 to C10 alkyl group, or a C6 to C20 aryl group, and

* is a linking portion to an adjacent atom present in a backbone of the copolymer.

18. The quantum dot complex of claim 17, wherein the polymeric outer layer further comprises an intermolecular or intramolecular crosslinking moiety that links the reactive moieties of the copolymer.

19. The quantum dot complex of claim 18, wherein the crosslinking moiety is represented by Chemical Formula 1 or Chemical Formula 2:

Chemical Formula 1
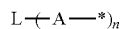

wherein, each A is the same or different and is independently an amide group, an ester group, a thioester group, an ether group, a thioether group, a C1 to C20alkylene group, a C3 to C20 alkenylene group, or a combination thereof, L is a C1 to C20 aliphatic hydrocarbon group, a C3 to C40 alicyclic hydrocarbon group, or C6 to C40 aromatic hydrocarbon group,

* is a linking portion to the reactive moiety of the copolymer, and n is an integer ranging from 2 to 7 wherein n is less than or equal to valence of L, Chemical Formula 2
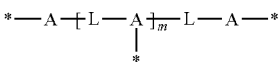

wherein, each A is the same or different and is independently an amide group, an ester group, a thioester group, an ether group, a thioether group, a C1 to C20 alkylene group, a C3 to C20 alkenylene group, or a combination thereof, each L is the same or different and is independently a C1 to C20 aliphatic hydrocarbon group or a C6 to C40 aromatic hydrocarbon group,

* is a linking portion to the reactive moiety of the copolymer, and m is an integer ranging from 1 to 10.

20. The quantum dot complex of claim 17, wherein the first repeating unit comprises a moiety in a backbone or as a pendant group of the copolymer, which is capable of interacting with the surface of the quantum dot, the organic ligand compound bonded to the surface of the quantum dot, or a combination thereof.

21. The quantum dot complex of claim 17, wherein the moiety capable of interacting with the organic ligand compound bonded to the surface of the quantum dot is a monovalent or divalent aliphatic hydrocarbon group, a monovalent or divalent aromatic hydrocarbon group, or a monovalent or divalent fluorinated aliphatic hydrocarbon group.

22. The quantum dot complex of claim 17, wherein the first repeating unit is represented by Chemical Formula 3:

Chemical Formula 3
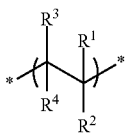

wherein, $R^1$, $R^2$, $R^3$, and $R^4$ are independently hydrogen, C1 to C20 alkyl group, a C1 to C20 alkyl group substituted with a functional group capable of bonding to the surface of the quantum dot, a C6 to C40 aryl group, a C6 to C40 aryl group substituted with a functional group capable of bonding to the surface of the quantum dot, a C7 to C40 arylalkyl group, a C7 to C40 arylalkyl group substituted with a functional group capable of bonding to the surface of the quantum dot, a C1 to C30 fluoroalkyl group, a C1 to C30 fluoroalkyl group substituted with a functional group capable of bonding to the surface of the quantum dot, a C1 to C30 perfluoroalkyl group, or a C1 to C30perfluoroalkyl group substituted with a functional group capable of bonding to the surface of the quantum dot, provided that $R^1$, $R^2$, $R^3$ and $R^4$ are not simultaneously hydrogen.

23. The quantum dot complex of claim 17, wherein the reactive moiety of the second repeating unit is present in a backbone or as a pendant group of the copolymer.

24. The quantum dot complex of claim 17, wherein the copolymer is a random copolymer.

25. The quantum dot complex of claim 17, wherein the copolymer is a styrene-maleic anhydride copolymer, a styrene-maleimide copolymer, or a combination thereof.

* * * * *